United States Patent [19]

Nakagome et al.

[11] Patent Number: 5,264,743
[45] Date of Patent: Nov. 23, 1993

[54] SEMICONDUCTOR MEMORY OPERATING WITH LOW SUPPLY VOLTAGE

[75] Inventors: Yoshinobu Nakagome, Hachioji; Kiyoo Itoh, Higashikurume; Hitoshi Tanaka, Tachikawa; Yasushi Watanabe, Hanno; Eiji Kume, Matsuyama; Masanori Isoda, Sayama; Eiji Yamasaki, Fussa; Tatsumi Uchigiri, Kokubunji, all of Japan

[73] Assignees: Hitachi, Ltd.; Hitachi VLSI Engineering Corporation, Tokyo, Japan

[21] Appl. No.: 621,064

[22] Filed: Nov. 29, 1990

[30] Foreign Application Priority Data

Dec. 8, 1989 [JP] Japan .................. 1-317518
Jan. 22, 1990 [JP] Japan .................. 2-012237
Feb. 23, 1990 [JP] Japan .................. 2-041076

[51] Int. Cl.$^5$ .............................. H03K 19/00
[52] U.S. Cl. ............................... 307/473; 307/443; 307/296.8; 307/296.5
[58] Field of Search ............ 307/443, 473, 475, 296.4, 307/296.5, 296.6, 296.8

[56] References Cited

U.S. PATENT DOCUMENTS

| | | | |
|---|---|---|---|
| 4,988,888 | 1/1991 | Hirose et al. | 307/473 |
| 5,055,713 | 10/1991 | Watanabe et al. | 307/473 |
| 5,075,577 | 12/1991 | Okitaka | 307/473 |
| 5,083,043 | 1/1992 | Yoshida | 307/296.8 |
| 5,140,194 | 8/1992 | Okitaka | 307/473 |

OTHER PUBLICATIONS

Tohru Furuyama, et al., "An Experimental 4-Mbit CMOS DRAM", IEEE *Journal of Solid-State Circuits*, vol. SC-21, No. 4, Oct. 1986, pp. 605-610.
Takashi Ohsawa, et al., "A 60-ns 4-Mbit CMOS DRAM with Built-In Self-Test Function", *IEEE Journal of Solid-State Circuits*, vol. SC-22, No. 5, Oct. 1987, pp. 663-667.
Katsutaka Kimura, et al., "Power Reduction Techniques in Megabit DRAM's", *IEEE Journal of Solid-State Circuits*, vol. SC-21, No. 3, Jun. 1986, pp. 381-389.
Syuso Fujii, et al., "A 50-uA Standby 1M×1/256K×4 CMOS DRAM with High-Speed Sense Amplifier", *IEEE Journal of Solid-State Circuits*, vol. SC-21, No. 5, Oct. 1986, pp. 643-647.
Masakazu Aoki, et al., "A 60-ns 16-Mbit CMOS DRAM with Transposed Data-Line Structure", *IEEE Journal of Solid-State Circuits*, vol. 23, No. 5, Oct. 1988, pp. 1113-1119.
Kazumasa Yanagisawa, et al., "A 23ns 1Mbit BiCMOS DRAM", *ESSCIRC Digest of Technical Papers*, Sep. 1989, pp. 184-187.

Primary Examiner—Edward P. Westin
Assistant Examiner—Andrew Sanders
Attorney, Agent, or Firm—Fay, Sharpe, Beall, Fagan, Minnich & McKee

[57] ABSTRACT

The present invention is intended to operate a semiconductor device at high speed with low voltage. A circuit configuration is used in which the transfer impedance between a common I/O line and a data line is changed depending on whether information is to be read or written. A current/voltage converter is provided which includes a MISFET different in conduction type to a select MISFET. Thus, the speed of reading information is increased. An intermediate voltage generator having high driving capability is provided. Thus, the circuit has sufficient driving capability for an LSI having large load capacitance. A voltage converter is provided which converts a data line supply voltage or word line supply voltage to a higher voltage. Therefore, stabilized signal transmission is ensured.

4 Claims, 30 Drawing Sheets

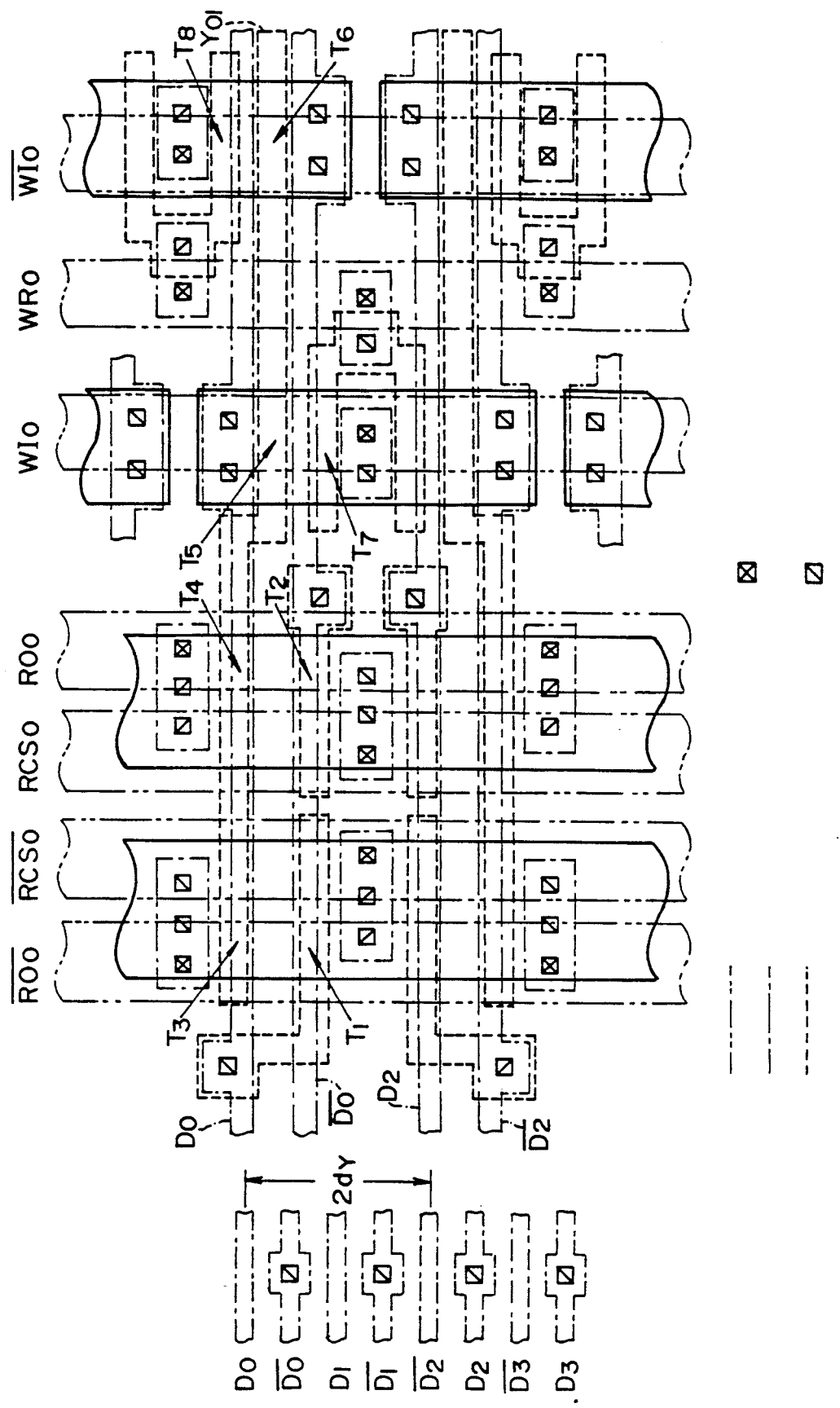

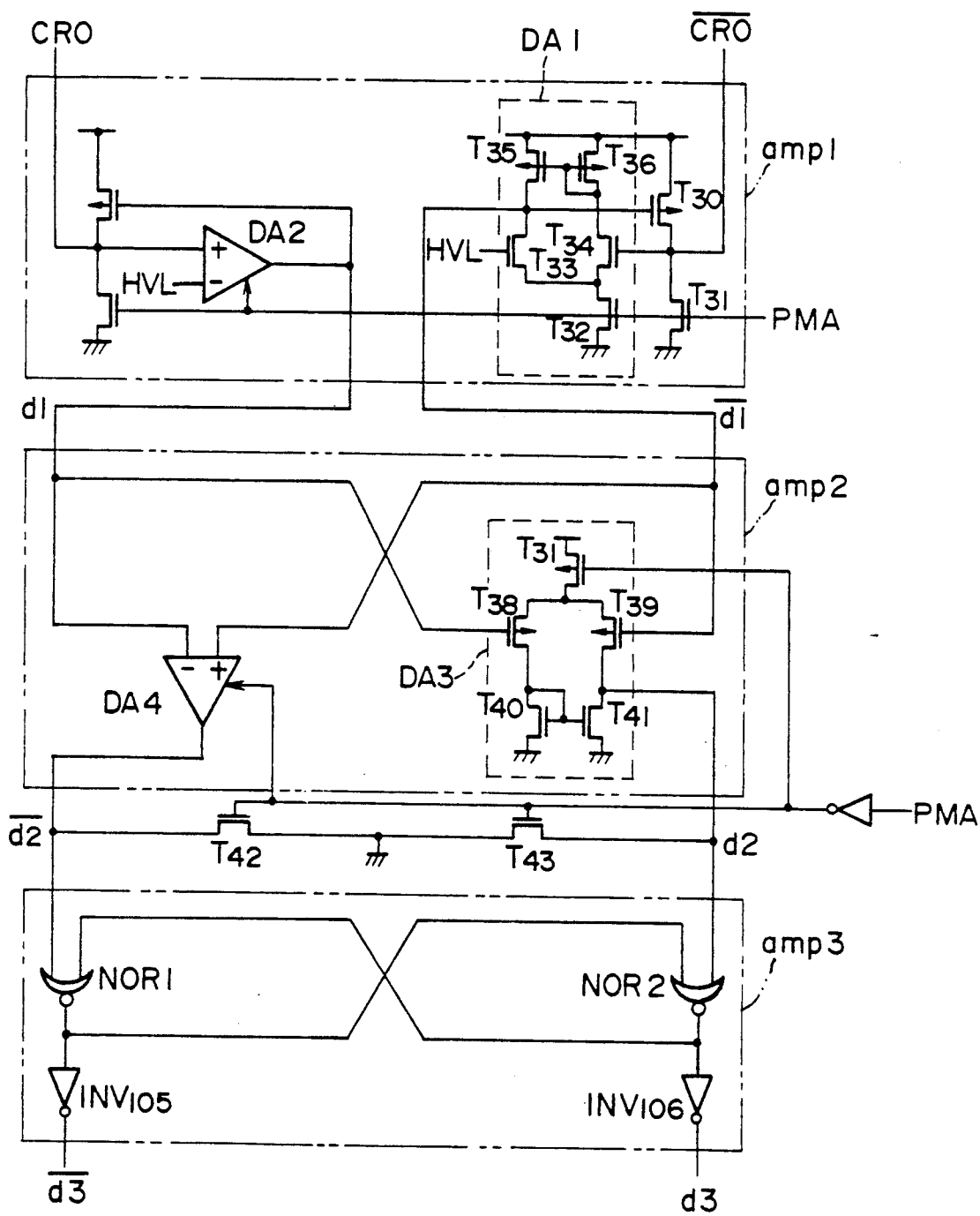
FIG. IE

SEMICONDUCTOR MEMORY OPERATING WITH LOW SUPPLY VOLTAGE

CROSS-REFERENCE TO RELEVANT APPLICATIONS

The present application is relevant to U.S. patent application Ser. No. 366,869 filed Jun. 14, 1989, entitled "Large Scale Integrated Circuit For Low Voltage Operation" in the names of J Etoh et al. and the contents of which are incorporated herein by reference.

BACKGROUND OF THE INVENTION

The present invention relates to a semiconductor device and more particularly to a semiconductor device having high integration density, composed of miniaturized elements and operable with batteries or low voltage at high speed.

The density of an LSI (Large Scale Integration) has been increased by miniaturizing MOS transistors as its components. In so-called LSIs with deep sub-micron dimension where the size of the elements is 0.5 microns or less, an increase in the power consumption of the LSIs and a decrease in the breakdown voltage of the elements become an issue. In order to cope with such problem, it is considered to be effective means to reduce the operating voltage of the elements as the elements are miniaturized. Five volts are mainly used as the supply voltage for the current LSIs, so that techniques which mount a voltage down converter which converts an external supply voltage to an internal supply voltage on an LSI chip as means for constituting an LSI with miniaturized elements are described in IEEE Journal of Solid-State Circuits, Vol. 21,-No. 5, pp. 605–610, October 1986. In this case, the external and internal supply voltages are 5 and 3.5 volts, respectively. As just described above, the problem of power consumption is being revealed in LSIs, especially in the highest density DRAMs (Dynamic Random Access Memories). There is a move to reduce the external supply voltage for the LSIs in conformity to such tendency. For example, the external power supply for a 64-megabit DRAM using, for example, 0.3-micron patterning technologies is expected to be reduced to about 3.3 volts. As the density of the LSIs increases, the external supply voltage may be further decreased.

Recently, as electronic portable equipment has been used widely, the demand for a low-voltage low-power consumption LSI which is operable with batteries and able to store information with batteries increases. For these applications, an LSI which operates a minimum voltage of 1–1.5 volts is required. Especially, in the case of a dynamic memory, its density has already reached a megabit level. There is also a move to use dynamic memories in the field of large capacity memory systems in which only magnetic disk units could conventionally be used. To this end, it is necessary to back up the dynamic memories with batteries such that no data is lost even if the power source is turned off. Usually, the backup interval requires a few weeks to a few years. Therefore, the power dissipation in the memory is required to be minimized. To achieve low power dissipation, it is effective to reduce the operating voltage. If the operating voltage is reduced to about 1.5 volts, a single dry battery will suffice for the backup power source. The cost and the space which the power source occupies are reduced.

In a CMOS (Complementary MOS) LSI, for example a processor, composed of only inverters and various digital logic circuits, no great decrease in the performance will be invited if device dimensions and gate threshold voltages of the MOS transistors are selected appropriately, even if the power supply voltage is reduced to about 1.5 volts. However, in an LSI which uses an external supply voltage and its intermediate voltages for operating purposes, a definite degradation has been brought about in performance. An DRAM is typical of such LSIs.

The conventional DRAMs, mainly used, have problems with the following three elements in terms of high speed operation and stable operation when operated with low voltage:

(1) An input/output (I/O) control circuit which reads a small signal from a memory cell;

(2) A circuit which generates a high voltage required for word line driving to transmit a signal; and (3) An intermediate voltage generator.

These circuits of the prior art will be described in order.

Concerning (1), as an LSI increases in density and scale, parasitic capacitance on signal lines also increases. Therefore, the operating speed of the LSI decreases. In the case of a dynamic memory, the speed of amplifying a small signal read to a data line from each memory cell using a sense amplifier and the operating speed of an input/output signal line (common I/O line) to read information from a selected data line occupies a large percentage of the operating speed of the entire memory, and techniques for increasing such speeds are indispensable for improving the performance of the memory. A conventional input/output control circuit is described, for example, in IEEE, Journal of Solid-State Circuits, Vol. SC-22, No. 5, October 1987, pp. 663–667. In this article, a system is described which controls the connection of a pair of data line and a pair of common I/O lines by applying a select signal to the gate electrodes of two MISFETs (Metal Insulator Semiconductor Field Effect Transistors). However, this system has the drawback that the propagation delay of a signal is increased under the use of low voltage.

Concerning (2), a conventional example is shown in FIG. 9. This shows a circuit related to a memory cell array (MA) and a word driver (WD) of a DRAM. FIG. 10 shows the waveforms at several elements of the circuit. This circuit is disclosed, for example, in IEEE, Journal of Solid-State Circuits, Vol. SC-21, No. 3, June 1986, pp. 381–389. According to this system, no high voltage is applied to a word line when a low supply voltage is used.

Concerning (3), for example, see IEEE, Journal of Solid-State Circuits, Vol 21, No 5, pp. 643–647, October 1986. However, the techniques disclosed this article have the drawback that the driving capability is greatly reduced when a low supply voltage is used.

U.S. application Ser. No. 366, 869 filed Jun. 14, 1989 is an earlier application directed also to a low voltage-operated semiconductor device related to the semiconductor memory according to the present invention.

SUMMARY OF THE INVENTION

In view of the above prior art, the present invention is intended to solve the following subjects.

The subject of the prior art of (1) to be solved is as follows. FIGS. 2A and 2C shows a conventional system. The detailed description of the FIGS. 2A and 2B will be made later. According to this system, the I/O control circuit can be composed of a minimum required number of transistors, it is effective for reducing the entire area of the memory However, the memory has the following drawbacks:

(a) If I/O control MISFETs (T50, T51) are put in an on-state before enough voltage difference is established between data lines (D0, $\overline{D0}$). the operation of an sense amplifier SA0 is disturbed and fails:

(b) For the above reason, a timing margin is required to be set from the time when the sense amplifier is started to the time when the MISFETs are put in the on-state by applying a select signal Y01 to the MISFETs. Therefore, the operating speed is reduced (FIG. 2C).

(c) In order to prevent such operation failure, restrictions in design are imposed on the ratio in channel (or drain-source) conductance of the first-mentioned MISFETs to the MISFETs constituting the sense amplifier. Generally, the former is required to be smaller than the latter. In this case, it is difficult to obtain a large driving capability for the common I/O lines (IO0, $\overline{IO0}$). Thus the operating speed is further reduced.

(d) Mainly for the reason of (c), it is difficult to write or read data in parallel between the single common I/O line pair and a plurality of data lines connected to the common I/O line pair. Therefore, the parallel testing scheme by selecting multiple I/O gates cannot be applied to the conventional system.

For these reasons, it was impossible to provide a circuit system suitable for a high density memory which operates at high speed even with a low supply voltage and has a capability of highly parallel testing.

FIGS. 9 and 10 show the conventional example concerning (2). As shown in FIG. 10, the voltage at node N2 is $VL - VT + \alpha(VL - 2VT)/(1 - \alpha)$. The voltage on the word line is $(VL - 2VT)/(1 - \alpha)$ where VL is the supply voltage, VT is the threshold value of the transistors, and is the ratio of the gate capacitance of QD to the entire capacitance of node N2 (i.e. the sum of the gate capacitance of QD and the parasitic capacitance of node N2).

Assume here that VL is 1.1 volts. If $\alpha = 0.9$ and $VT = 0.5$ volts, the voltage at N2 is 1.5 volts from the above equation. Therefore, the voltage on the word line increase only to 1.0 volts. Usually, the threshold value of the switching transistor QS of the memory cell is 0.5 volts or more which is higher than that of the peripheral circuits, so that a quantity of electric charges stored in the memory cell is $CS \times 0.5$ which is less than half of the maximum value ($CS \times 1.1$). Therefore, resistance to soft error, and the S/N ratio of the sense amplifier are greatly reduced. Thus, the stored data is likely to be readily destroyed.

If the DRAM is intended to be operated with batteries using the conventional techniques, and the electromotive force of the batteries may be reduced to a value which is substantially twice as high as the threshold voltage VT of the MOS transistors, the word driver malfunctions. Therefore, the write voltage for the memory cell is reduced to thereby destroy data easily. This problem must be solved.

Concerning (3), a conventional example is shown in FIG. 22. The conventional system generates an intermediate voltage using a single complementary push-pull circuit stage. However, the load capacitance is increased due to increased density of the LSI. Therefore, the driving capability becomes insufficient and the response speed is reduced. Other problem is that the voltage accuracy and hence S/N ratio are reduced, because the VT variation is not scaled when operating voltage reduces.

In the present invention, input/output (I/O) control circuits which read/write data from/to data lines are alternately disposed on the right and left sides of the memory array. A circuit configuration is employed which changes the transfer impedance between the common I/O line and data line depending on whether information is to be read or written. Current-to-voltage converting means with the driving MISFET which has a different conduction type from I/O gates is provided as a sense circuit which senses a signal on the read (RO) line. Therefore, the input/output control circuits are laid out at pitches which are twice as wide as the data lines. Compared to the conventional system, the input/output circuit construction is provided without increasing the chip area. Also, the operational margin of the input/output circuits is greatly improved and hence the input/output circuits is operated at high speed with low voltage.

A circuit system which includes a complementary push-pull circuit and a current mirror amplifier is composed of field effect transistors the gate threshold voltages of which can be reduced. By feedback of the output, variation of driving capability of the intermediate voltage generator are reduced with a low supply voltage. Since the intermediate voltage generator has high driving capability, it charges/discharges the load capacitance at high speed.

By using the output of voltage converter means in the present invention as a power source for the word driver, it is possible to apply as the word line voltage a voltage which is higher than the data line voltage by the threshold voltage of the switching transistors of the memory cell array. Therefore, even if the supply voltage is reduced to about 1 volts, the memory operation is stabilized.

It is an object of the present invention to provide an input/output control circuit system of a memory of superhigh integration density and operating at high speed even with low voltage.

It is another object of the present invention to provide an input/output control circuit system of superhigh integration density and operating in a stabilized manner even with low voltage.

It is a further object of the present invention to provide means for generating a sufficiently high word line voltage which prevents data destruction.

It is a still further object of the present invention to provide intermediate voltage generating means which has reduced output voltage fluctuations even with large load capacitance.

These and other objects and many of the attendant advantages of the present invention will be readily appreciated as the same become better understood by reference to the following detailed description when considered in conjunction with the accompanying drawings.

BRIEF DESCRIPTION OF THE DRAWINGS

FIGS. 1A to 1G show a first embodiment of the present invention;

DESCRIPTION OF THE PREFERRED EMBODIMENT

The present invention will now be described specifically with reference to its embodiments. In the following description, an dynamic memory (DRAM) to which the present invention is applied will be described. However, the present invention is applicable similarly to static memories (SRAMs) and read only memories (ROMs). The present invention is also applicable similarly to memories using bipolar elements, so-called BiCMOS memories including combined bipolar elements and MISFETs, and memories using semiconductor materials other than silicon.

Figure 1A:
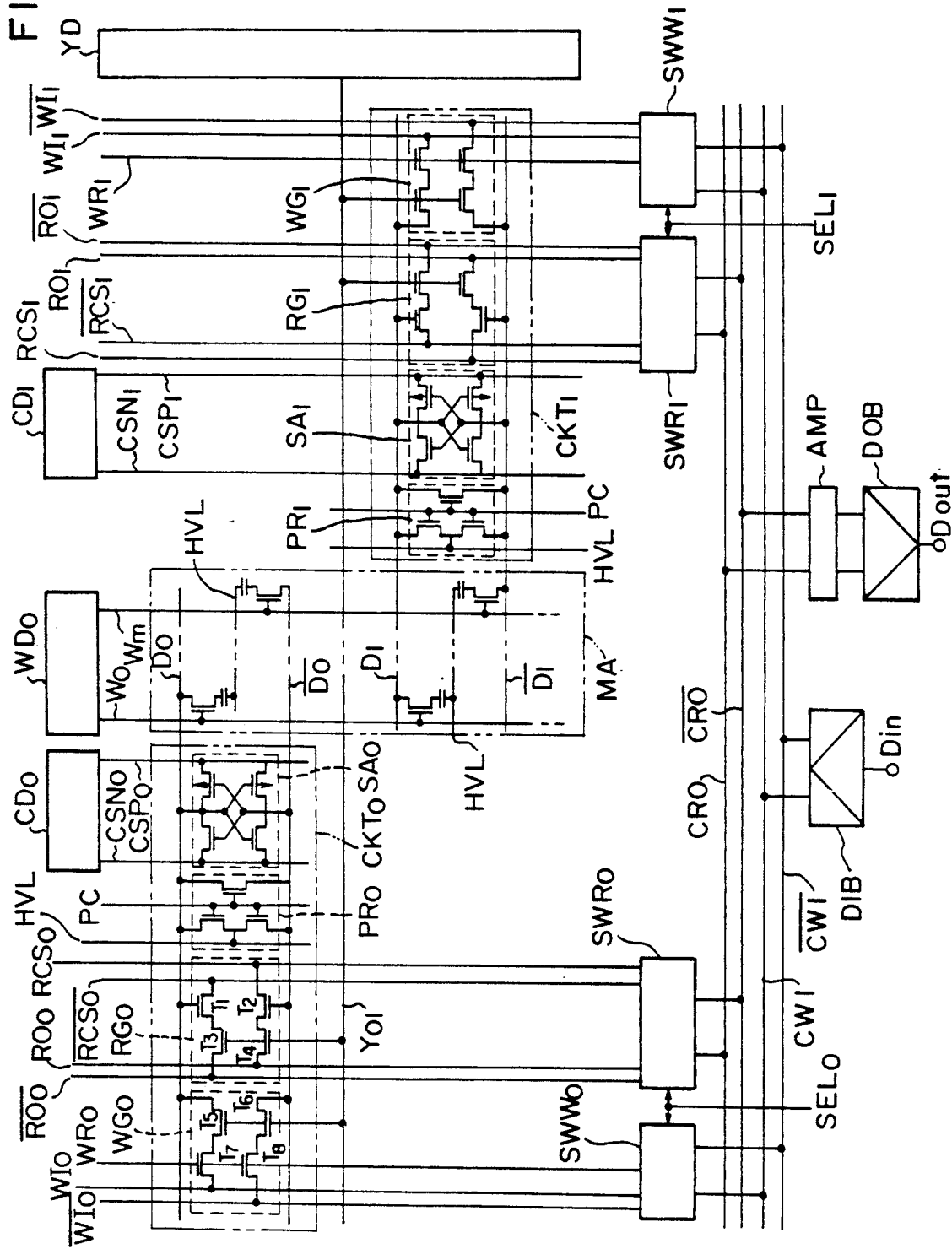

FIG. 1A shows one embodiment of a memory circuit of the present invention. In FIG. 1A, MA denotes a two-dimensional memory cell array of memory cells each including a single MISFET and a single storage capacitance; CKT0, CKT1, an input/output control circuit which detects a memory cell signal and transfers information through a read/write line to/from an external device; D0 and $\overline{D0}$, D1 and $\overline{D1}$, a data line pair which transfers a signal between a memory cell and the input/output control circuit; WD, a word line driver which designates a row address in the memory cell array to apply a drive signal to a word line; W0-Wm, a word line; YD, a Y(column) decoder which designates a column address in the memory cell array; and Y01, a column select line. In the input/output control circuit, SA0, SA1 denote a sense amplifier which senses a small signal voltage on a data line; CSN0 and CSP0, CSN1 and CSP1, drive signal lines for the sense amplifiers SA0, SA1, respectively; CD0, CD1, a drive signal generator for the corresponding sense amplifier; PR0, PR1, a precharge circuit which short-circuits the corresponding data line pair during non-operation and sets an appropriate voltage for the operation of the sense amplifiers; RG0, RG1, a read gate which reads a signal (voltage difference) appearing on the data line pair out of the corresponding memory array; T1-T4, N-channel MISFETs which constitute the read gate; WG0, WG1, a write gate which drives the corresponding data line in accordance with external information; and T5-T8, N-channel MISFETs which constitute a write gate; RO0, $\overline{RO0}$, RO1, $\overline{RO1}$, a read line; WI0, $\overline{WI0}$, WI1, $\overline{WI1}$, a write line; RCS0, $\overline{RCS0}$, RCS1, $\overline{RCS1}$, a read control line; WR0, $\overline{WR0}$, WR1, $\overline{WR1}$, a write control line; SWR0, SWR1, a switching circuit which connects or disconnects read lines with common read lines CR0, $\overline{CR0}$; SWW0, SWW1, a switching circuit which connects or disconnects write lines and common write lines CWI, $\overline{CWI}$; SEL0, SEL1, a signal which selects one of the right and left switches; AMP, a sense amplifier which senses and amplifies a signal appearing on CR0, $\overline{CR0}$; DOB, an output buffer; and DIB, an input buffer. In the present embodiment, the input/output control circuits CKT0, CKT1 are alternately disposed on the right and left sides of the memory cell array for the corresponding data line pairs. The I/O lines in the input/output control circuit are separated into a read (RO) line and a write (WI) line. A specific structure and effects of those elements will be described below.

FIG. 1B shows a layout of the read gate and a write gate. Generally, as the density of the memory increases, laying out the input/output control circuits Ci at data line pitches becomes more difficult. However, by alternately disposing the input/output control circuits on the right and left sides of the memory cell array as in the present embodiment, the layout pitches for the input/output control circuits become twice as wide as the pitch of data line pairs or 2dy. Therefore, laying out the input/output circuits is achieved without increasing the chip area. In a high integrated memory, there is the problem that the signal/noise ratio is greatly reduced due to capacitance coupling between adjacent data lines, as described, for example, in IEEE, Journal of Solid-State Circuits, vol. 23, No. 5, October, 1988, pp. 1113-1119. It is known that capacitance coupling noise produced in the memory cell array is reduced, for example, by transposing the data lines each other in the memory cell array. However, since the coupling capacitance between adjacent data lines in the input/output control circuit varies from point to point, noise cannot be reduced sufficiently. In the present embodiment, a shielded conductor is provided between data line pairs in the input/output control circuit to greatly reduce capacitance coupling noise between data lines compared to the conventional memory, which will be described below. In the layout of an input/output control circuit shown in FIG. 1B, a signal line is disposed between data line pairs with the signal line being formed together with the data line pairs. In the present embodiment, for example, read lines $RO_0$, $\overline{RO_0}$ and read control lines $RCS_0$, $\overline{RCS_0}$ disposed so as to intersect with data lines in a read gate RGi are connected through throughholes to conductors formed together the data lines so as to be parallel to the data lines. By doing so, parasitic capacitance between adjacent data lines is reduced, and coupling noise is suppressed to a minimum to thereby ensure a stabilized operation.

The specific structure of the read switch SWR0, write switch SWW0, and sense amplifier AMP will be described below.

Figure 1C:
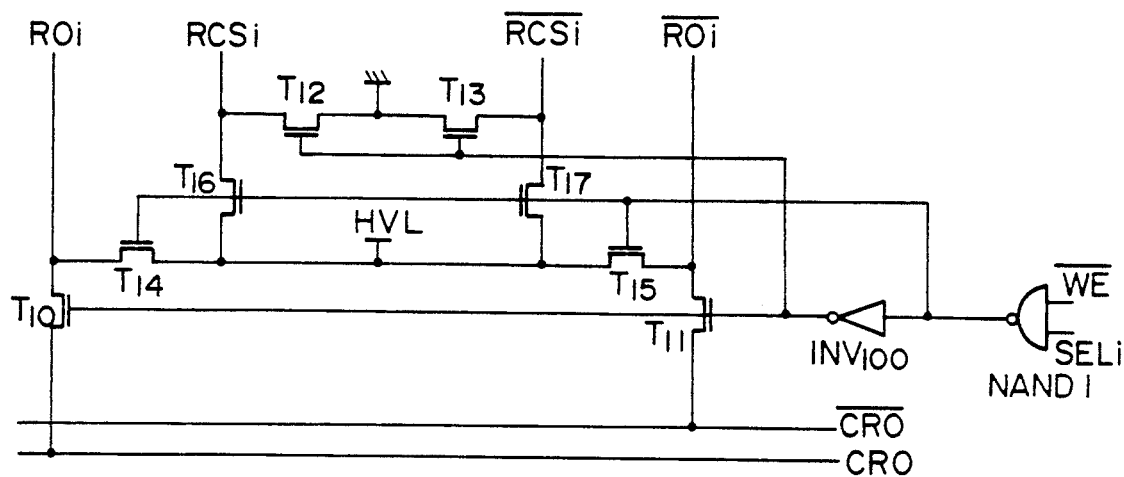

FIG. 1C illustrates the structure of the read switch SWRi (i=0, 1) which connects one pair of a plurality of read line pairs ROi, $\overline{ROi}$ selectively to common read lines CRO, $\overline{CRO}$. Simultaneously, it controls the voltages of the selected memory block read control lines RCSi, $\overline{RCSi}$ to extract a signal onto the read lines. In FIG. 1C, T10-T17 denote an N-channel MISFET: INV100, an inverter; NAND 1, a 2-input NAND gate which outputs low level only when all its inputs are high. When a memory block is selected and a select signal SELi is high and when the memory is in a read state and the write signal $\overline{WE}$ is high, MISFETs T10-T13 become conductive and T14-T17 become non-conductive. Therefore, the read lines ROi, $\overline{ROi}$ are connected to common read lines CRO, $\overline{CRO}$, respectively, and read control lines RCSi, $\overline{RCSi}$ are grounded Thus, when the column select signal YO1 becomes high, for example, in FIG. 1A, T3 and T4 become conductive, a signal is obtained which includes the difference between electric currents flowing from the read lines RO0, $\overline{RO0}$ to read control lines RCS0, $\overline{RCS0}$ in accordance with the voltage difference between the pair of data lines D0 and $\overline{D0}$. If the read control lines RCS0, $\overline{RCS0}$ are separated, parallel test can be made which examines defects in a memory cell to be described later in more detail.

When the memory block becomes non-selective and the select signal SELi becomes low or when the memory is in a written state and the write signal $\overline{WE}$ becomes low, MISFETs T10-T13 become non-conductive and T14-T17 become conductive. Therefore, the read lines ROi, $\overline{ROi}$ and read control lines RCSi, $\overline{RCSi}$ changed to the same voltage level (intermediate voltage level HVL, in this case). Thus, for example, even if the column select signal YO1 becomes high and T3 and T4 become conductive in FIG. 1A, no currents flow from the read lines ROi, $\overline{ROi}$ to read control lines RCSi, $\overline{RCSi}$. This is advantageous for selecting a column addresses in a plurality of memory blocks (including selected and non-selected blocks) using a single column select signal line, for example, as described in FIG. 4.

Figure 1D:
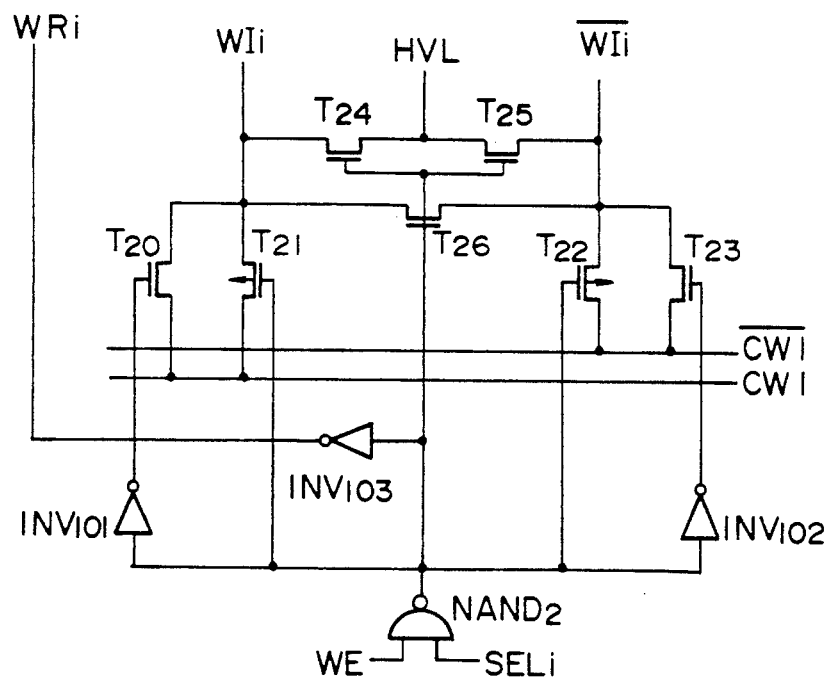

FIG. 1D illustrates the structure of a write switch SWWi (i=0, 1). This circuit selectively connects one of write line pairs WIi, $\overline{WIi}$ to common write lines CWI, $\overline{CWI}$. Simultaneously, it renders the selected memory block write control line WRi high for writing purposes. In FIG. 1D, T20, T23-T26 denote an N-channel MISFET; T21, T22, P-channel MISFET: INVs 101-103, inverter; NAND 2, 2-input NAND gate. If a memory block is selected so that a select signal SELi is high and when the memory is in a written state and write signal $\overline{WE}$ becomes high, MISFETs T20-T23 become conductive and T24-T26 become non-conductive. Therefore, write lines WIi, $\overline{WIi}$ are connected to common write lines CWI, $\overline{CWI}$, and high level is output onto write control line WRi. Thus, if column select signal YO1 becomes high, for example, in FIG. 1A, T5 and T6 become conductive. The pair of data lines D0, $\overline{D0}$ are connected to write line pair WI0, $\overline{WI0}$ such that write information on the write lines are written into the data lines.

When the memory block becomes non-selective and the select signal SELi become low or when the memory is in a read state and the write signal WE becomes low, MISFETs T20-T23 become non-conductive and T24-T26 become conductive. Therefore, the write lines WIi, $\overline{WIi}$ are connected to the same voltage level (intermediate voltage HVL, here). Simultaneously, the write control line WRi becomes low. Thus, even if the column select signal YO1 becomes high and T5 and T6 become conductive, for example, in FIG. 1A, the data lines and the write lines are not connected. This is advantageous for selecting column addresses of a plurality of memory blocks (including selected and non-selected blocks) using a single column select signal line, as will be described, for example, in FIG. 4.

FIG. 1E shows the structure of a sense amplifier for amplifying a signal read to the common read lines CRO, $\overline{CRO}$. In FIG. 1E, amp 1 denotes a first sense amplifier which has common read line inputs CR), $\overline{CRO}$ and outputs d1, $\overline{d1}$; amp 2, a second sense amplifier which has inputs d1, $\overline{d1}$ and outputs d2, $\overline{d2}$; amp 3, a third sense amplifier which has inputs d2, $\overline{d2}$ and outputs d3 and $\overline{d3}$; and T42, T43, a MISFET which initializes the third sense amplifier before its operation. The first sense amplifier amp 1 includes two current-to-voltage converters having the same structure and each including a differential amplifier DA1, P-channel MISFET T30 and an N-channel MISFET T31. The second sense amplifier amp 2 includes two differential amplifiers DA3 and DA4 having the same structure. The third sense amplifier amp 3 includes two NOR gates NOR1, NOR2 and two inverters INVs 105 and 106.

The operation of the present embodiment will be described with reference to the operating waveforms of FIGS. 1F and 1G. Here, an example will be described in which information read onto data lines D0, $\overline{D0}$ is read and external information is written onto D0, $\overline{D0}$. However, it is obvious that a similar operation is selectively performed on every memory cell in the memory array. Here, description is made assuming that the operating voltage is 1.5 volts. However, the present invention is not limited to this specific case and is applicable similarly to other cases in which different operating voltages are used to produce similar effects.

First, a reading operation will be described with reference to FIG. 1F. A control signal PC for a precharge circuit PR0 falls down at time t0 to thereby terminate a precharge operation on the data lines. The subsequently selected word line W0 rises at time t1 to read a signal from a memory cell to data lines d0, $\overline{d0}$. At t3, a sense amplifier drive signal CSP is changed from its intermediate voltage level to high level and CSN is changed from its intermediate level to low level to thereby drive the sense amplifier SA0. Thus, the signals read to the data lines are amplified to high or low level by the sense amplifier. In the present embodiment, the data lines are connected to the gates of the transistors T1, T2 in the gate RG0 and then through transistors T3, T4 to read lines RO0, $\overline{RO0}$. At t1, the read control lines RCS0, $\overline{RSC0}$ of the selected input/output circuit CKT0 are driven low. By this construction, the data lines are separated from the read lines. Therefore, during amplification, here, at t3, before the data lines are settled to high, low, no information on the data lines is destroyed even if the column select signal line YO1 is input to the input/output circuit. Therefore, the information on the data lines is transmitted to the read lines without destroying information on the data lines. Therefore, the reading speed is increased. The reason why the reading speed is increased and the effects compared with the prior art will be described in detail later. The voltage difference between the signal voltages RO0, $\overline{RO0}$ and CRO, $\overline{CRO}$ on the read lines and common read lines is about 20 mV, the amplitude of the output signal of the first sense amplifier (the voltage difference between d1 and $\overline{d1}$) and is about 200 mV, and the amplitude of the output signal from the second sense amplifier (the voltage difference between d2 and $\overline{d2}$) is about 1-1.5 V. Thus, the voltage gain of the first sense amplifier is about 10, the voltage gain of the sense amplifier is about 5-7, and the voltage gain of the third sense amplifier is about 1-2. The third sense amplifier has a so-called data-latch function which stores output information. Namely, the input signal is amplified and then changed to low such that an output corresponding to the input is held until the next input is received. Thus, it is unnecessary to keep all the first to third amplifiers operative at all times. After signals are output from the first to third amplifiers, the first or second amplifier or both may be kept inoperative to reduce power consumption.

Figure 1F:
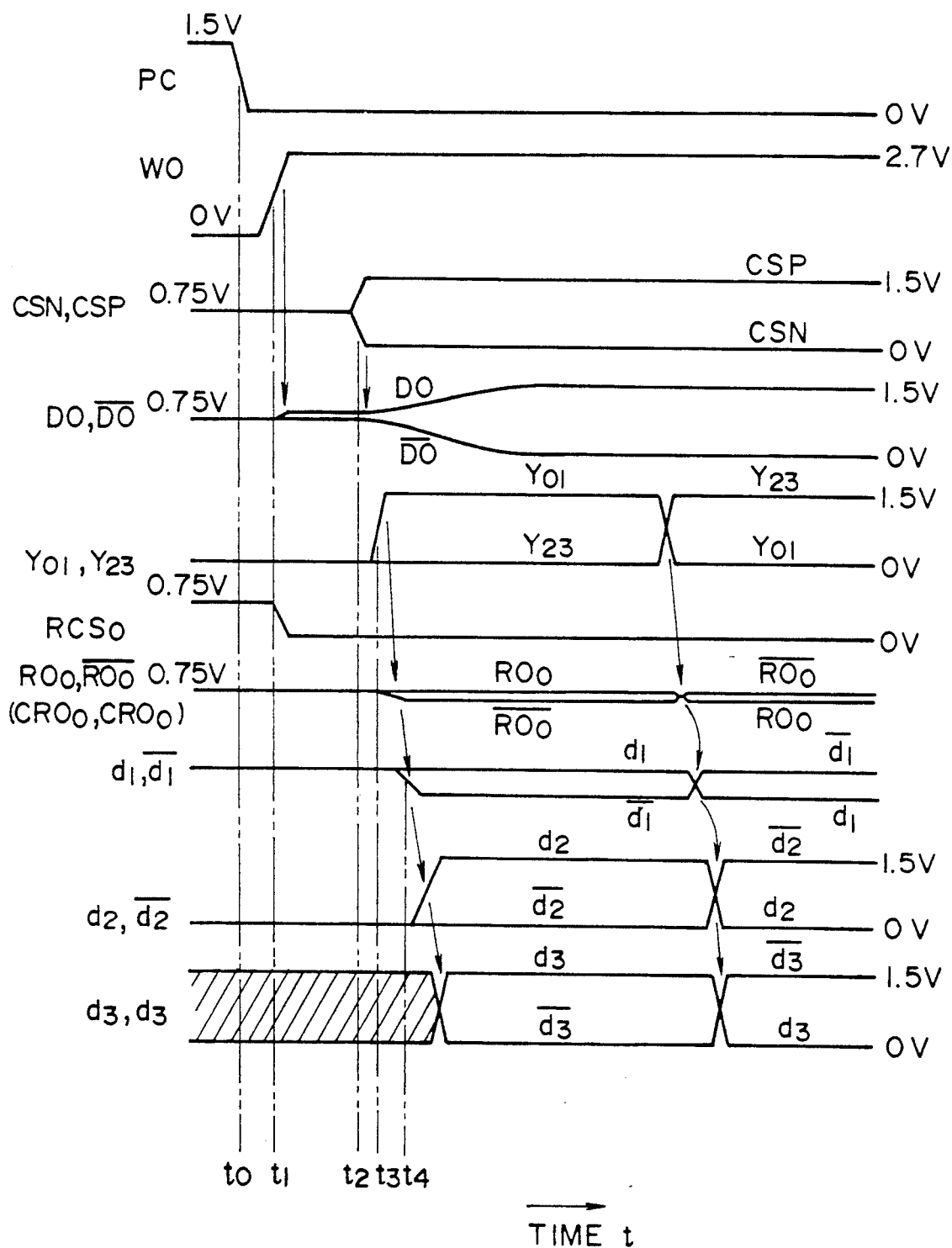
Figure 1G:
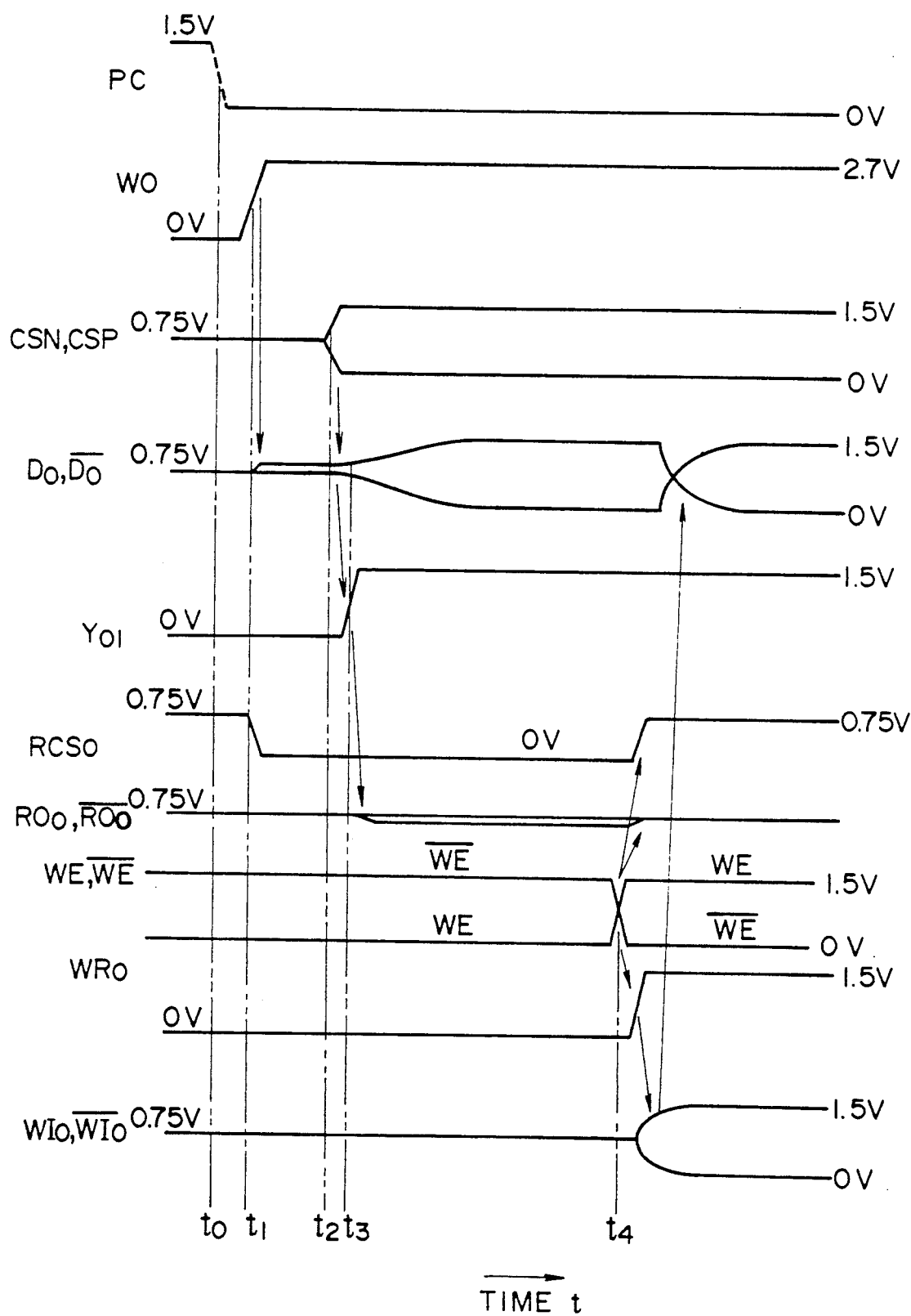

In FIG. 1F, a so-called static column operation is illustrated in which after one piece of information is read, another piece of information is read by selecting the corresponding column; namely, next to column select signal Y01, signal Y23 is caused to rise to read information. According to the present embodiment, as will be described later in more detail, the voltage amplitudes on the read lines and the common read lines are reduced to 20 mV, which is 1/10 of the voltage amplitudes on the conventional system read lines and common read lines, by feeding a current input to the sense amplifier. Thus, the times required for charging/discharging the parasitic capacitance on the read lines and common read lines are reduced to about 1/10 compared to the prior art. A delay required from the selection of a new address to the outputting of information is reduced greatly.

The write operation subsequent to the read operation will be described with reference to FIG. 1G in which the initial reading operation is the same as in FIG. 1F. When WE becomes high at t4, the control signal line RSC0 of RG0 becomes HVL (0.75 V) and the control signal line WR0 of the write gate WG0 becomes high with the column select signal line Y01 maintained high. At this time, if data is to be written is applied to the write input/output lines WI0, $\overline{WI0}$, data is written to the data lines D0, $\overline{D0}$ through transistors T5, T7 and T6 and T8 in the write gate WG0.

As illustrated in the above example, the read lines are separated from the write lines as one means for changing the transfer impedance between the I/O lines and the data lines in write and read operations. The read and write operation margins can thereby be set separately. Thus, even a low voltage operation is speeded up and stabilized.

Figure 2A:
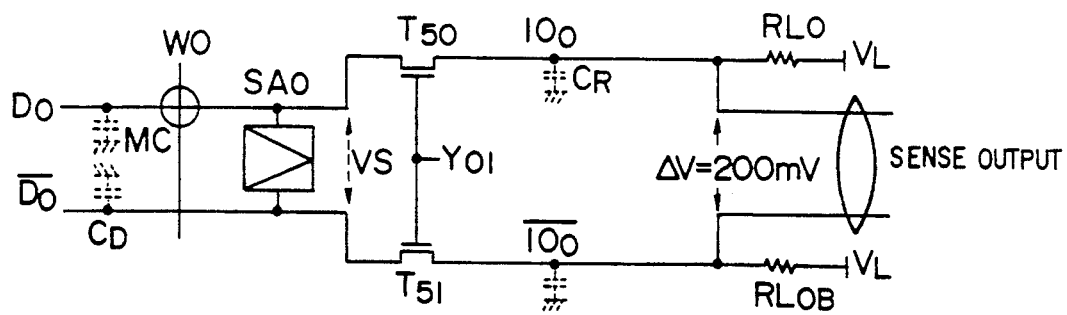
FIGS. 2A to 2E show the effects of the present invention.
Figure 2B:
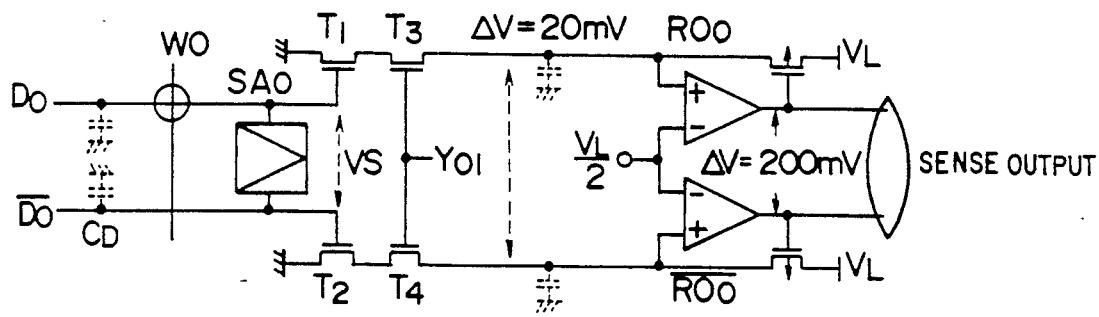
Figure 2C:
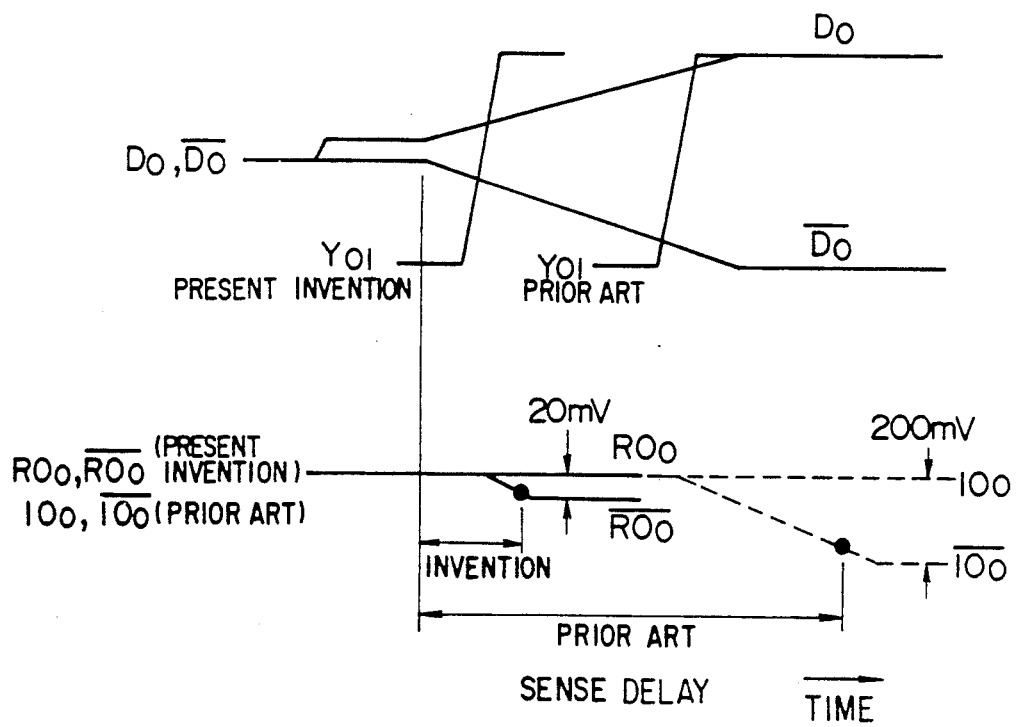

The effects of the sense amplifiers used in the present embodiment will be described with reference to FIG. 2. FIG. 2A shows a conventional sense amplifier, and FIG. 2B schematically illustrates the structure of the sense amplifier according to the present invention. FIG. 2C schematically illustrates the operating waveforms of the conventional and inventive sense amplifiers. In the conventional sense amplifier, a samll signal read from the memory cell MC to the data lines (D0, $\overline{D0}$) is amplified by the sense amplifier SA0 to turn on MISFETs T50, T51 controlled by a column select signal Y01 and delivered to read lines (IO0. $\overline{IO0}$). The conventional amplifier has two problems of hindering an increase in the operating speed thereof. One is that a signal must be required to be amplified sufficiently by the sense amplifier before turning on the MISFETs. If otherwise, a large quantity of electric charges would flow into the data lines (about 0.3 pF for CD) from the read lines (about 8 pF for CR) because the data lines and the read lines differ by scores of times in capacitance. Therefore, the information which is started to be amplified would be destroyed. Another problem is that the read line having large parasitic capacitance must be amplified to a large voltage such as 200 mV using a sense amplifier having a small drive capability. This is because an enough signal voltage is required by the next-stage second sense amplifier.

To this end, in the present invention, a read gate is provided which includes NMOS transistors T1 and T2 and which receives at its gate a signal on the data lines such that the sense amplifier is separated from the read lines. Further, a current sense circuit is provided which includes a P-channel MISFET amplifier which is different in conduction type from the former transistors. Namely, by using a current as the input to the sense amplifier, the amplitude of a voltage on the signal lines is reduced to provide a voltage output proportional to the current input. By separating the sense amplifier from the read lines, MISFETs T3, T4 are turned on which are controlled with a column select signal without awaiting sufficient amplification of the data lines. Thus, voltage information on the data lines is converted to current information for high-speed reading purposes. By using a current-input type sense amplifier, the amplitude of a voltage on the signal lines is reduced by about one order of magnitude (200 mV to 20 mV) compared to the conventional technique. Thus, the time required for charging/discharging the parasitic capacitance CR is greatly reduced to result in higher-speed operation.

Figure 2D:
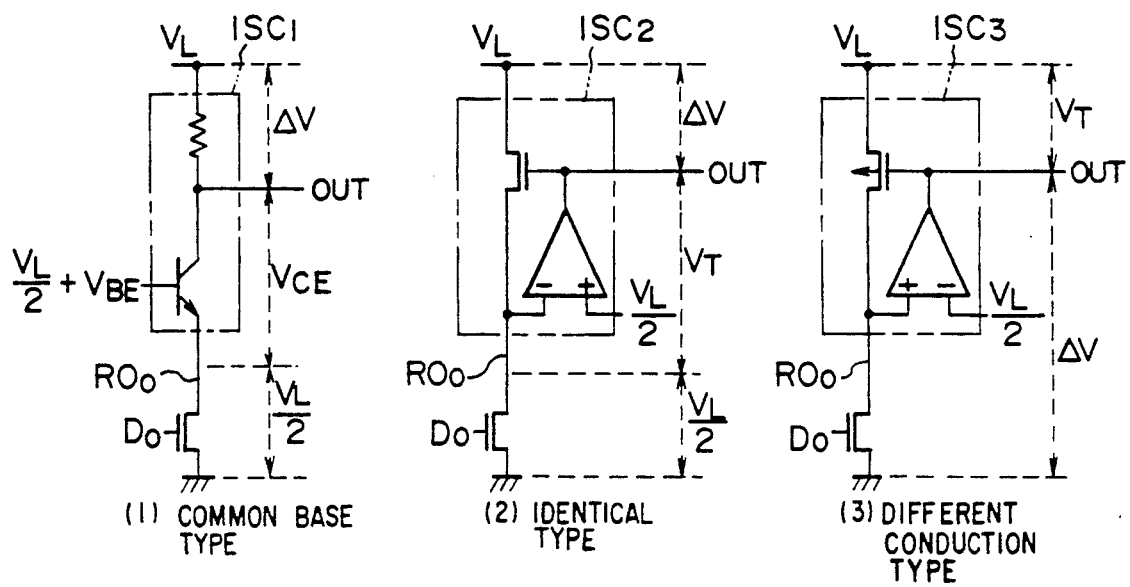

In the present invention, the MISFETs of the read gate and current sense circuit are different in conduction type because such arrangement provides a current sense amplifier which operates with the lowest voltage. The effects of this structure will be described below. FIG. 2D shows the various structures of the current sense circuit. In FIT. 2D, ISC1-ISC3 denote a current sense circuit; RO0, a common read line. An N-channel MISFET connected below RO0 simply illustrates a series connection of the read gate and selective gate for convenience sake. In order to cause the conditions to coincide with each other, the RO line is biased to VL/2 which is one half of the source voltage VL in any case.

In FIG. 2D:

(1) denotes a common base type. The current sense circuit ISC1 includes a bipolar transistor and a resistor. This circuit system is described, for example, in ES-SCIRC Digest of Technical Papers, pp. 184-187, September 1989;

(2) denotes an identical type. The current sense circuit ISC2 includes a drive MOS transistor of the same conductive type as the read gate and a differential amplifier. This circuit system is described, for example, in IEEE JOurnal of Solid-State Circuits, vol. 23, No. 5, pp. 1113-1119, October 1988; and (3) denotes á different conduction type which includes a drive MOS transistor different in conduction type from the read gate and a differential amplifier. In this case, the difference between the voltage on the RO line and the reference voltage is amplified to control the gate voltage of the MISFET for negative feedback. Thus, the amplitude of the voltage on the RO lines is reduced. The amplitude of the input voltage is $\Delta V/A$ and the sense output $\Delta V = Is/Gm$ where Is is the signal current, A is the voltage gain of the differential amplifier, Gm is the mutual conductance of the MISFET, and $\Delta V$ is the sense output. Therefore, if Gm is selected appropriately (settable freely in accordance with the size of the MISFET) in accordance with the value of the signal current, the amplitude of the input voltage will be reduced to 20 mV or 1/10 compared to the conventional technique where $A=10$ and $\Delta V=200$ mV.

The minimum operating voltages for these sense circuits will be compared. For simplifying purposes, the following are assumed: all the threshold voltages of the MOS transistors are equal and the absolute value of the threshold values is VT, the amplitude of the sense output signals (dynamic range) is $\Delta V$ and the bias voltage to the read signal line (RO line) is VL/2.

The operating conditions for the common base type in (1) are given by $$VL > VL/2 + VCE + \Delta V.$$

Therefore, the minimum operating voltage is given by $$VL > 2(VCE + \Delta V)$$

where VCE is the difference in voltage between the collector and the emitter. It is necessary to set VCE to a value high to some extent (for example, 0.7 V or more) to avoid the saturation of the bipolar transistor. The symbol $\Delta V$ denotes the amplitude of the sense output signal. It is preferable to ensure that the amplitude is 0.4 V or more in consideration of an operational margin. Therefore, the minimum operating voltage is 2.2 V.

The operating conditions for the same type in (2) are given by $$VL > VL/2 + VT + \Delta V.$$

Therefore, the minimum operating voltage is given by $$VL > 2(VT + \Delta V).$$

If the threshold voltage VT is 0.5 V, the minimum operating voltage is 1.8 V.

The drawbacks common to the conventional proposed (1) and (2) systems are that the RO line is connected to the emitter of the bipolar transistor or to the source of the MISFET. Therefore, the difference in voltage between the base and the emitter or the threshold voltage should be assigned to a value between the supply voltage VL and the bias voltage VL/2 of the RO line. On the other hand, in the present invention, the drive element and read gate each include a PMOS transistor different in conduction type, as shown in (3). The drains of those transistors are connected to the RO line to remove the restrictions to the above voltages. The operating conditions and the minimum operating voltage for the different conduction type current sense circuit are given by $$VL > VT + \Delta V.$$

The minimum operating voltage is 0.9 V where the threshold voltage VT is 0.5 V. Thus, the different conduction type current sense circuit of (3) is the most suitable for low voltage operation.

Figure 2E:
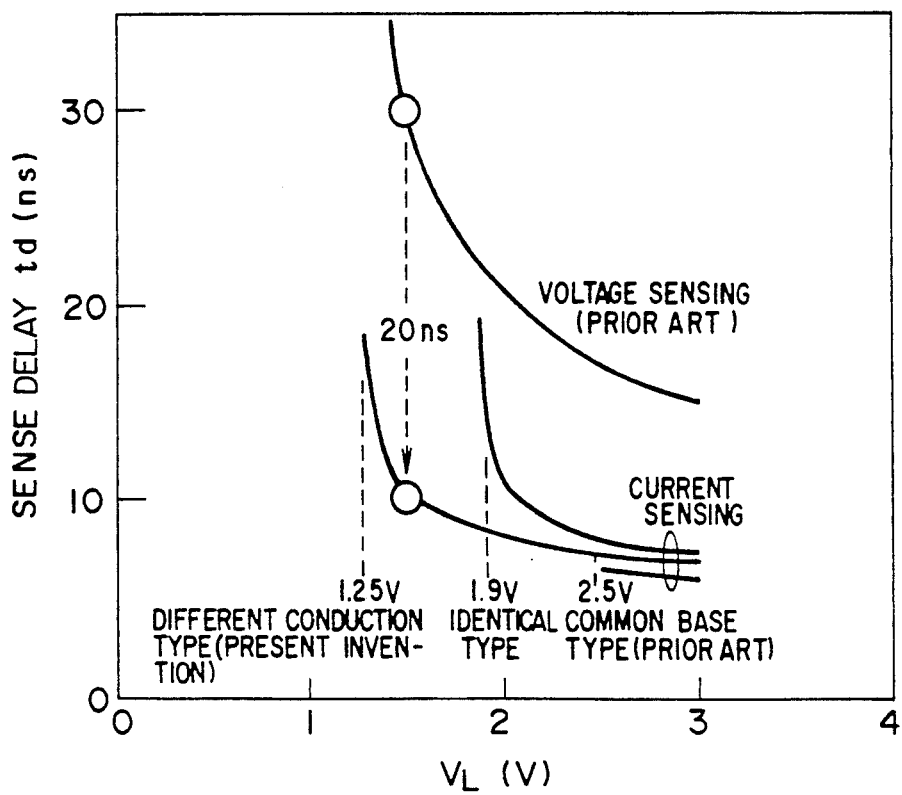

FIG. 2E shows the comparison of the operating speeds of the conventional and inventive sense amplifiers on the basis of the result of computer simulation. The sense time is defined by a delay time taken from applying signals CSN and CSP to the sense amplifier to start same to obtaining a signal voltage of 200 mV on the I/O line (in the case of the conventional voltage sense type amplifier). Alternatively, it is defined as a delay time taken from applying the signal CSN and CSP to obtaining a 200 mV output from the first sense amplifier (in the case of a current sense type amplifier). Any of the current sense types operates at high speed. However, the common base type and the identical type minimum operating voltages are 2.5 V and 1.9 V, respectively, and those amplifiers do not operate with 1.5 V. These facts coincide well with the result of the analysis mentioned above. In contrast, the minimum operating voltage is 1.25 V in the different conduction type sense circuit, which operates at high speed with the lowest voltage. The lower limit of the operating voltage is determined not by the operation of the sense circuit itself, but by the lower limit of the operating voltage of the sense amplifier which amplifies a signal on the data line. Namely, the sense circuit itself is operable with a voltage lower than 1.25 V. Compared to the conventional voltage sense type, the present invention serves to increase the operating speed by 20 ns with 1.5 V.

As described above, in the present embodiment, the input/output control circuits are alternately disposed on the right and left sides of the memory cell array and the read and write input/output lines are separated from each other to thereby increase the operating speed of the DRAM and stabilize same even in a low voltage operation. By constructing the first sense amplifier, which detects a signal on the read lines, with a current-to-voltage converter and using a MISFET for read line driving and a MISFET different in conduction type from the former MISFET for converting a voltage on the data lines to a current through the read lines, a sense amplifier system which operates at high speed even with a low supply voltage such as about 1-2 V is provided.

Figure 3:
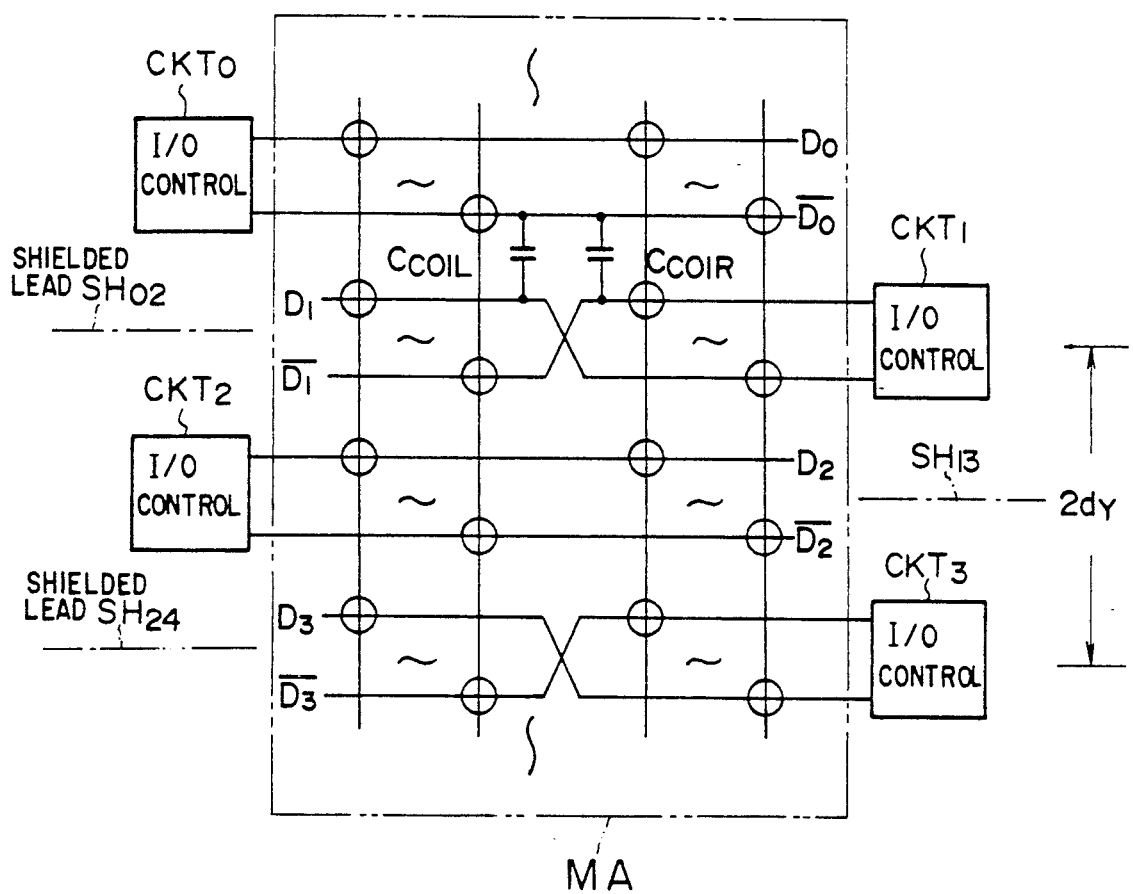
FIG. 3 shows an embodiment which improves the effects of the first embodiment of FIGS. 1A to 1G.

FIG. 3 shows an embodiment intended for further stabilized operation. As mentioned above, the parasitic capacitance between the data lines is reduced in the input/output control circuits. In the present embodiment, further stabilized operation is intended by balancing parasitic capacitance between the data lines in a part of the memory cell array. To this end, the data lines are disposed each other in pairs at the center of the memory cell array. The parasitic capacitance between D1 and data into $\overline{D0}$ and between $\overline{D1}$ and data line $\overline{D0}$ are $Cc01_L$ and $Cc01_R$, respectively. Since $Cc01_L$ and $Cc01_R$ coincide, the parasitic capacitance between D1 and $\overline{D0}$ and that between $\overline{D1}$ and $\overline{D0}$ can be made equal. Similarly, the parasitic capacitance between D1 and data line D2 and that between $\overline{D1}$ and data line D2 can be made equal. Therefore, parasitic capacitance between the respective data lines of a pair and an adjacent different data line can be made equal, so that the read operation can be further stabilized also in the memory cell array.

Figure 4:
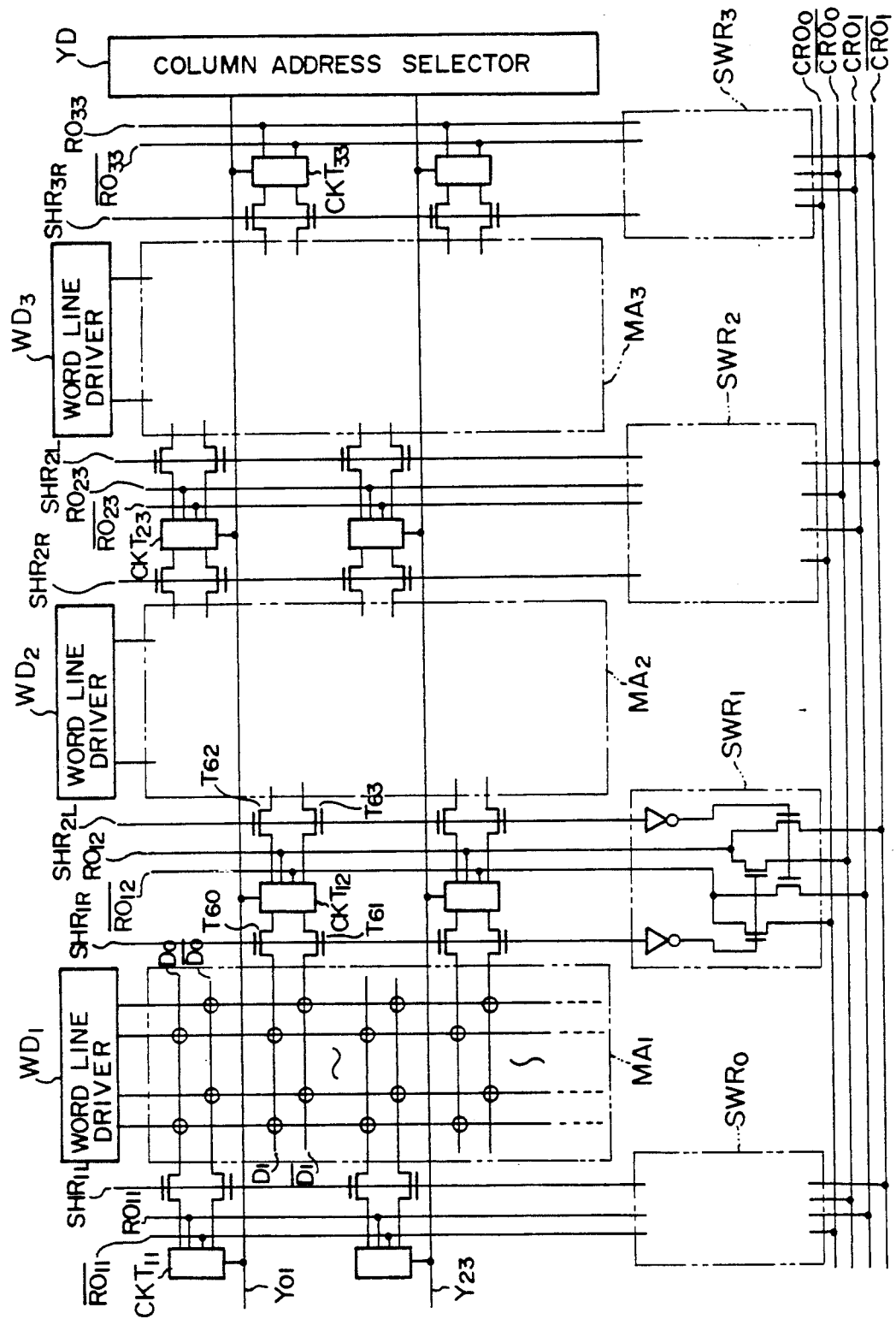
FIG. 4 shows an embodiment in which a plurality of memory arrays are provided.

FIG. 4 shows an embodiment which includes a plurality of memory cell arrays. A read operation will here be described. An input/output control circuit CKTij is shared by memory cell arrays disposed on the right and left sides of the input/output control circuit. Switching transistors T60, T61 are disposed between a CKTij and one adjacent memory cell array, and switching transistors T62, T63 between that CKTij and the other adjacent memory cell array. The switching transistors receive at their gates a memory cell array select signal SHRij. SWRi denotes a switch which connects a particular read line RO to a common read line CRO which is used, in common, by a plurality of RO lines containing that particular read line RO and which receives a memory cell array select signal SHRij. SHRij is set to high beforehand. Thus, if, for example, a memory cell array MA2 is selected, only $SHR1_R$ and $SHR3_L$ are rendered low. Assume here that a column select signal Y01 is selected. The signals read to the data lines D1, $\overline{D1}$ and D0, $\overline{D0}$, are read through the input/output control circuits CKT12, 23 to RO12, $\overline{RO12}$ and RO23, $\overline{RO23}$. These signals are further read through switches SWR1, SWR2 to the common I/O lines CRO0, $\overline{CRO0}$, and CR01, $\overline{CR01}$. Like this, even if there are a plurality of memory cell arrays, alternate disposition of input/output control circuits on the right and left sides of each memory cell array such that one input/output control circuit is shared by adjacent memory cell arrays serves to prevent a significant increase in the chip area. Thus, improvements to the characteristics mentioned above are realized.

Figure 5A:
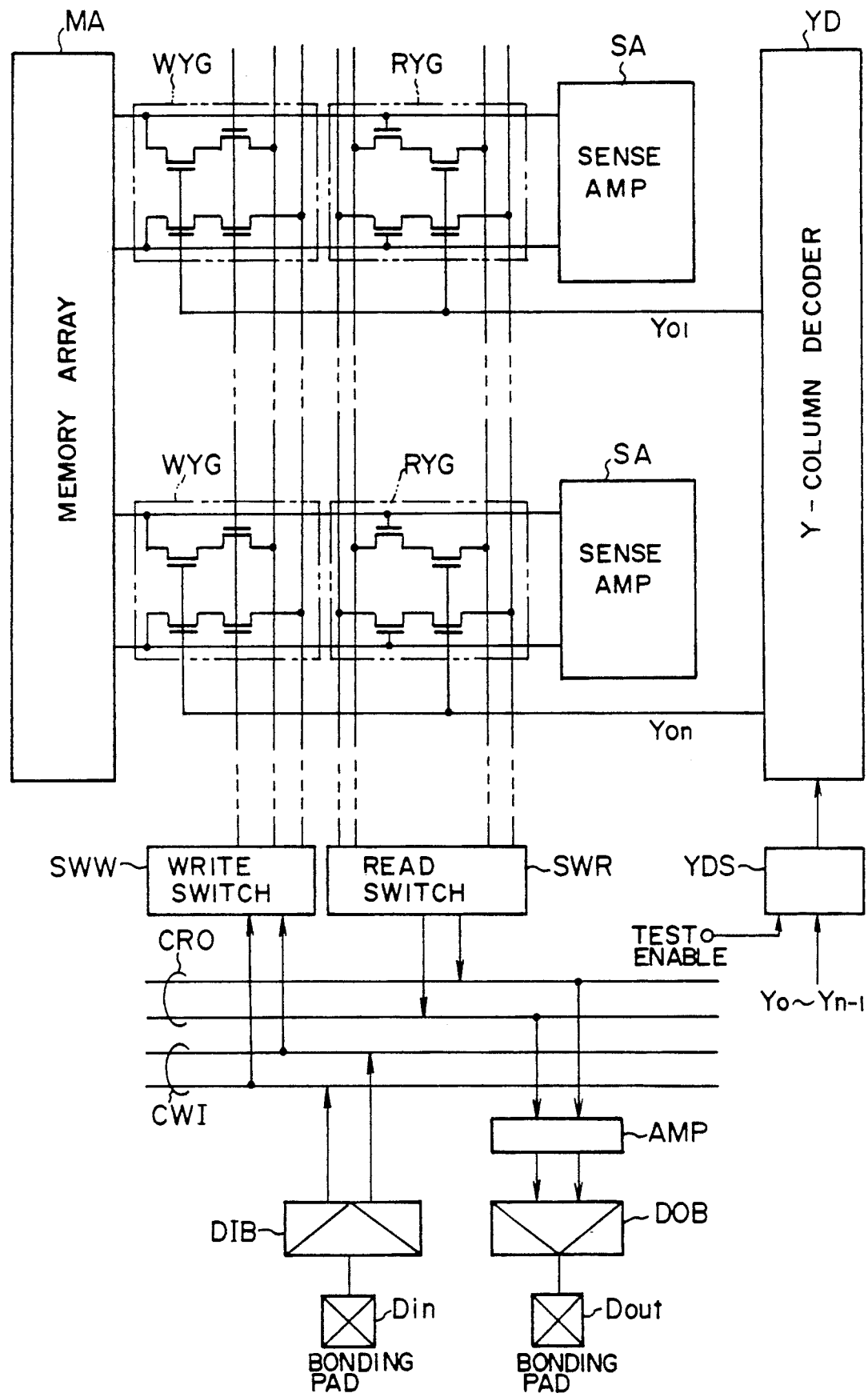
FIGS. 5A to 5F show an embodiment for parallel test.
Figure 5B:
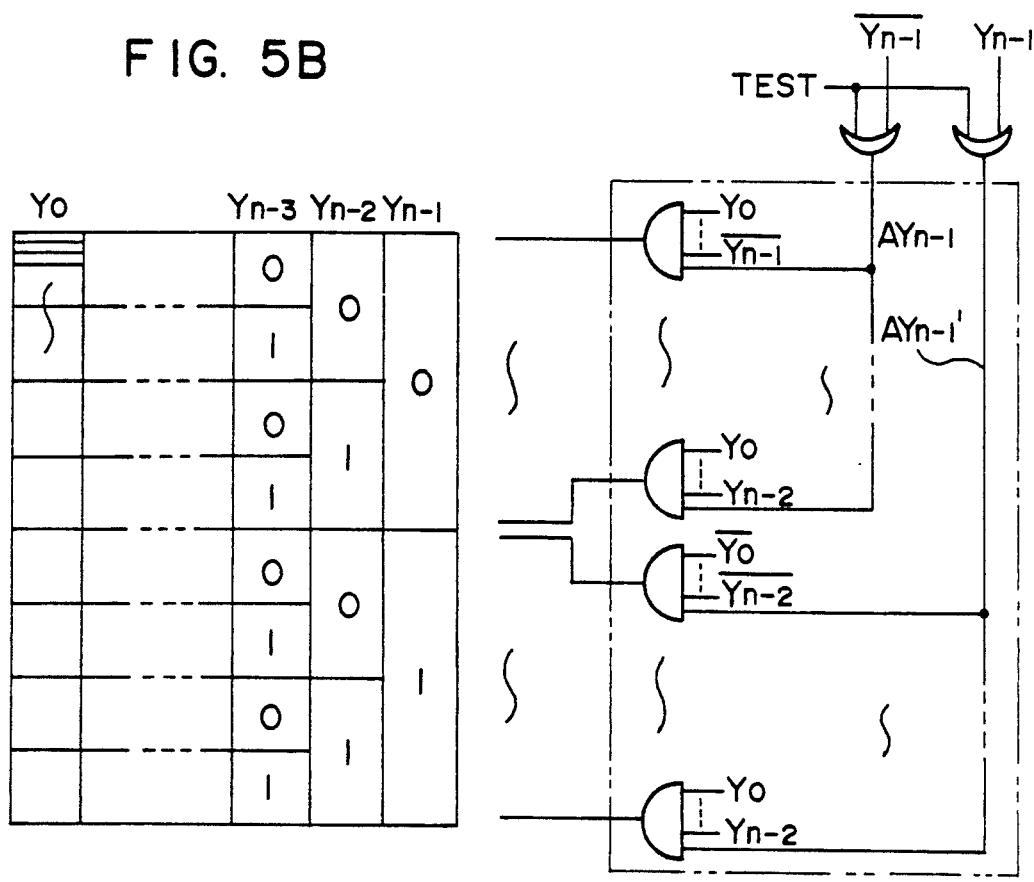

FIG. 5A shows an embodiment of the present invention to test defects in a memory cell in a parallel manner. The parallel test is given by selecting a plurality of column select signals simultaneously (multi-selection). Namely, in parallel test, a multiplicity of column select signals is selected with a test signal TEST. Thus, in reading, read signals from the data lines are simultaneously read to the read lines in accordance with degree of multiplicity. If the simultaneously read pieces of information on the data lines coincide, one of the read lines RO, $\overline{RO}$ becomes high and the other becomes low. If at least one piece of wrong information is read, both the RO and $\overline{RO}$ become low. In the write operation, data is written onto the data line connected to the write gate selected by the write input/output line. the feature of the present invention is that the provision of a new test I/O line is unnecessary even in parallel test. Therefore, data is transmitted from the data line to AMP like a regular test. Since the read signal line is separated from the write signal line, a separate operational margin can be set for each of the read and write operations, as mentioned above. Therefore, no limitations to an increase in the degree of multiplicity are eliminated to thereby achieve high-degree parallel reading/writing operations. In FIG. 5A, there are a pair of drive signal lines RCS for a read gate RG such that in reading, RCS lines connected to read line RO, $\overline{RO}$ are separated from each other. This is means effective to determine one wrong read operation also when the degree of multiplicity is increased. When the degree of multiplicity is increased, the current flowing from RO to RCS is required to be increased. The current flowing from RCS to GND is saturated at a given value due to resistance of the read line; in other words, the voltage level of the RCS increases. Therefore, if the RCS is not separated, the signal current on the I/O line where wrong read is made decreases as the degree of multiplicity increases, so that it is difficult to detect. The voltage level of the RCS on the side where wrong read is made does not increase due to the separation of the RCS, so that only the current flowing from RO to RCS is required to be detected and hence high accuracy detection is made. As mentioned above, the present invention achieves high degree parallel test to thereby greatly reduce the test time. FIG. 5B shows an embodiment of a specified circuit used for determining the degree of multiplicity. Normally, Y0−Yn−1 are input to column decoder YD. Yn−1 is divided into two in column, Yn−2 is divided into four and so forth. Y0 changes state from "0" (low) to "1" (high) and vice versa in response to each column select signal. Assume here that test signal TEST is high, and let AY−1 and AY−1′ represent the OR gate output signals on the basis of Yn−1, $\overline{Yn-1}$ and TEST. By inputting these signals to the column decoder in place of Yn−1, $\overline{Yn-1}$, the signals AYn−1, AYn−1′ are both rendered high in spite of whether Yn−1 is high or low. Thus, two column select signals can be selected and hence the degree of multiplicity can be 2.

Figure 5C:
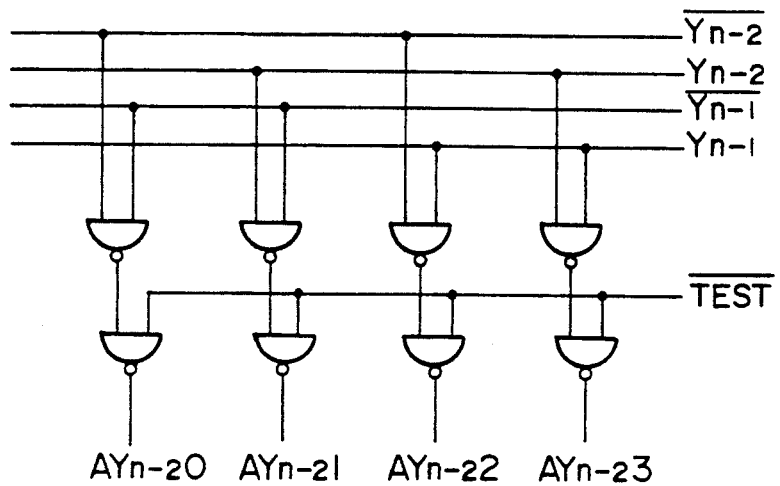

FIG. 5C shows an embodiment in which the degree of multiplicity is 4. The NAND gate outputs for Yn−1 and Yn−2 are input together with TEST to corresponding NAND gates and their outputs AYn−2 0 to AYN−2 3 are input to the column decoder, in which case the degree of multiplicity is 4. In both the embodiments of FIGS. 5B and 5C, a multiplicity of column decoders can be selected when parallel test is made. In a regular test, a single column select signal is selected by making the test signal TEST low.

Figure 5D:
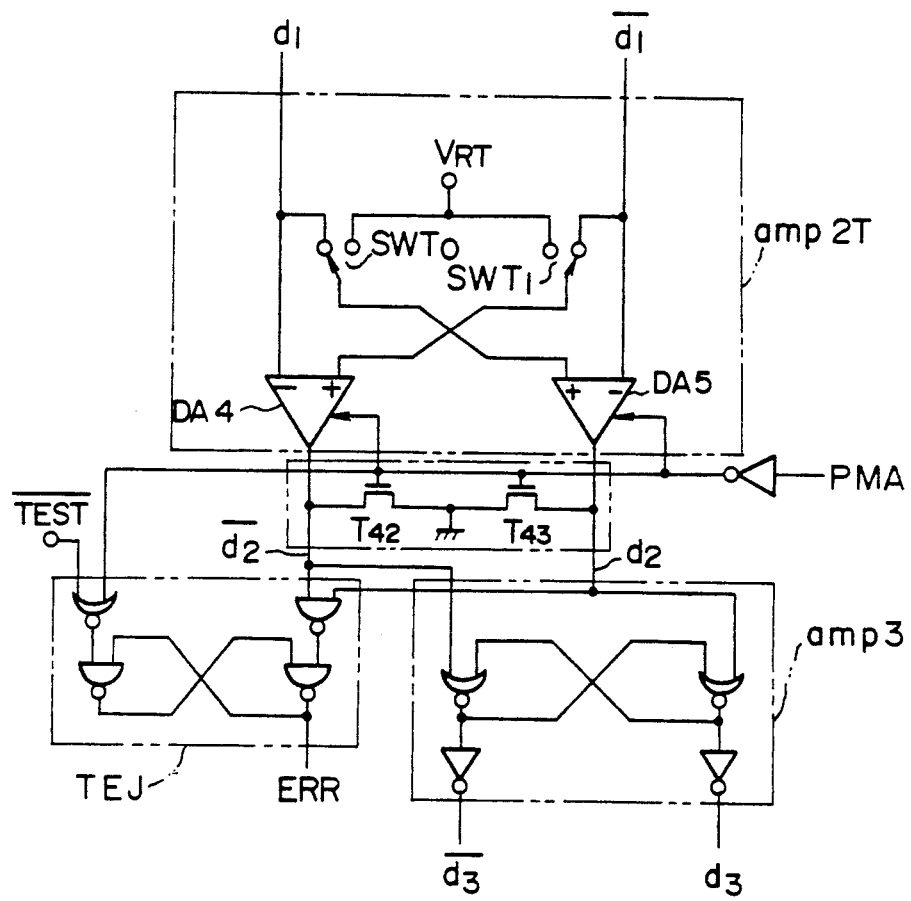

FIG. 5D shows an embodiment of a sense amplifier to realize parallel test. A process for outputting the result of parallel test will be described with reference to FIG. 5D. In a regular read operation, the outputs obtained by current-to-voltage conversion are input to inverse and non-inverse terminals of two differential amplifiers DA4 and DA5 constituting a part of the amp2T. The output of amp2T is input to amp3. In parallel test, $V_{RT}$ is input as a reference voltage to the non-inverse inputs of the two differential amplifiers DA4 and DA5. In parallel test, if at least one piece of wrong information is present in the multiple selected data lines, electric currents flow through both RO and $\overline{RO}$. Therefore, the current-to-voltage conversion outputs d1, $\overline{d1}$ of the first sense amplifier amp1 become low. The reference voltage $V_{RT}$ is beforehand set to a voltage between the high and low levels of the current-to-voltage conversion outputs. By doing so, the two amplifiers DA4 and DA5 output become high if at least one piece of wrong information is involved. In other words, if both the voltage levels d2, $\overline{d2}$ are high, it is determined that the pieces of information read in parallel contain wrong information. In parallel test, $\overline{TEST}$ is made low to input the outputs from DA4, DA5 to a determination circuit TEJ, which renders ERR high or low in accordance with the output voltages from d2, $\overline{d2}$. If all the results of the parallel test are correct, ERR is low while if at least one of the results is wrong, ERR is high. In this way, determination on the result of the parallel test in which the degree of multiplicity is increased is made by using the input/output circuit systems and sense amplifiers according to the present invention.

Figure 5E:
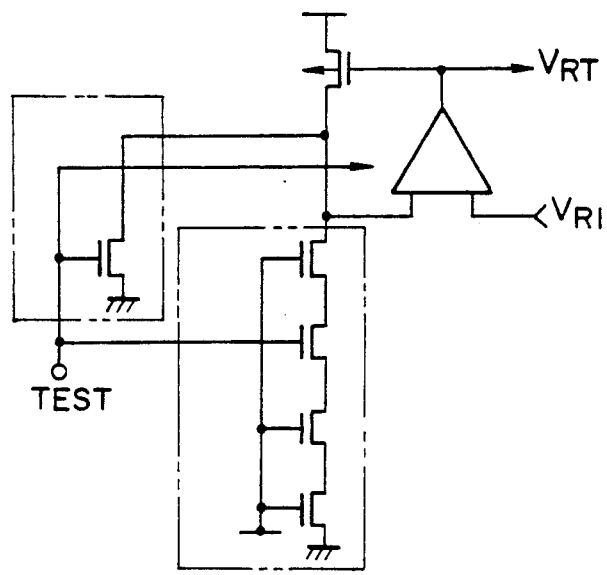

FIG. 5E shows an embodiment of the reference voltage $V_{RT}$ generator used for parallel test. In FIG. 5E, the current-to-voltage converter, mentioned above, is also used. In parallel test, $V_{RT}$ is generated by rendering the parallel test signal TEST high. In this circuit, a reference current corresponding to half of the signal current is applied to the input of the current-to-voltage converter. Thus, if signal currents flow through both the RO lines, the converted voltage becomes smaller than $V_{RT}$. If the result of the parallel test is correct, one converted voltage is higher than $V_{RT}$. Therefore, by comparing the converted voltage with $V_{RT}$, determination of the result of the test can be made.

Figure 5F:
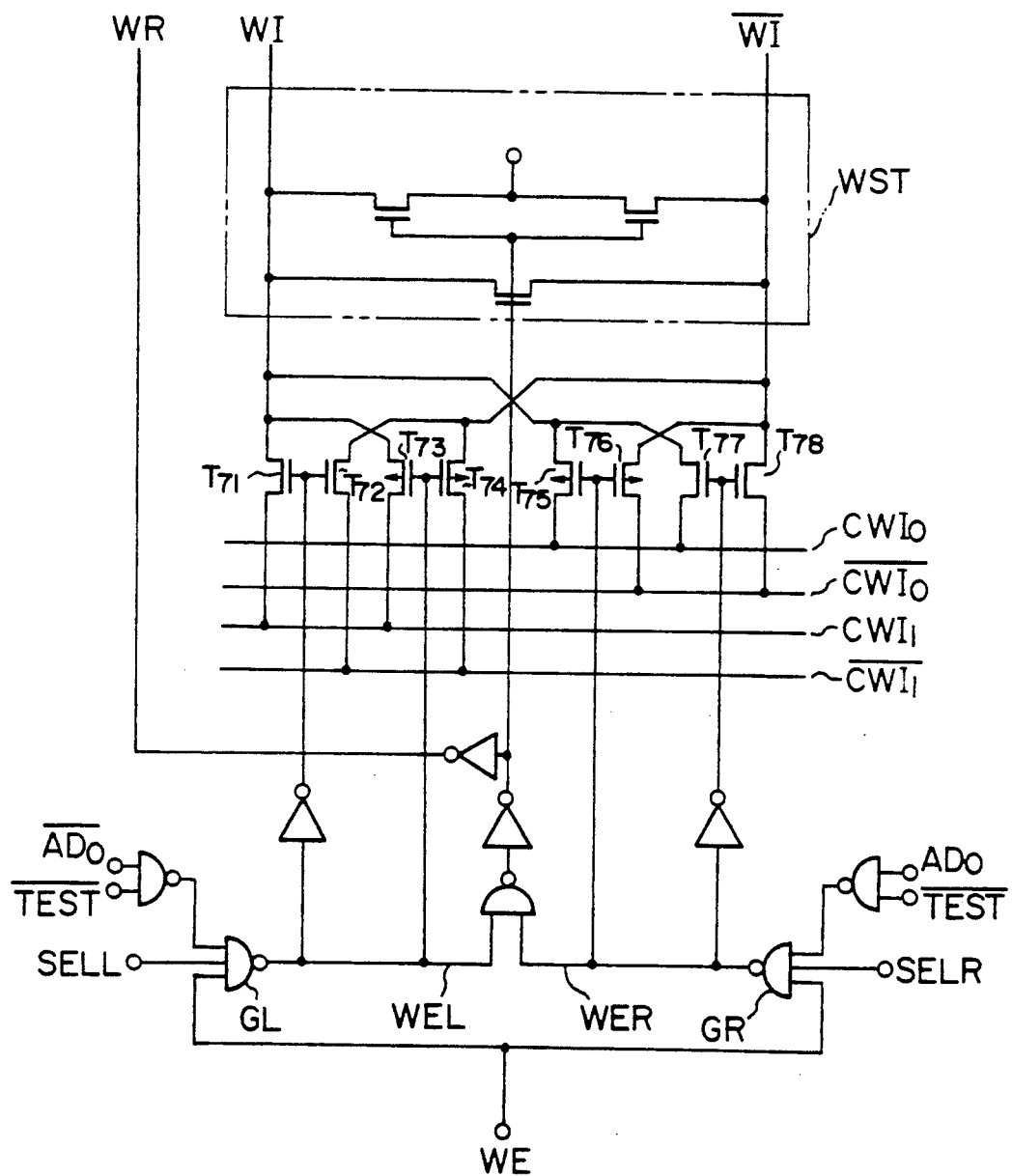

FIG. 5F is a specified embodiment of the write switch SWW. Reference characters WE denotes a write signal. The present embodiment presupposes that there are a plurality of memory cell arrays shown in FIG. 4. Assume that the memory cell array on the right-hand side of SWW operates (SELR is high an SELL is low). In parallel test, TEST is low. In reading, WE is low and WI, $\overline{WI}$ are set at the same voltage level by a circuit WST. When a write operation starts, WE becomes high. All the signals input to GR become high in the reading operation. Therefore, WER becomes low and WEL becomes high. Therefore, the write control signal WR becomes high. Data is written into WI, $\overline{WI}$ from CWI, $\overline{CWI}$ through N-channel MISFETs T77, T78 and P-channel MISFETs T75, T76.

Figure 6:
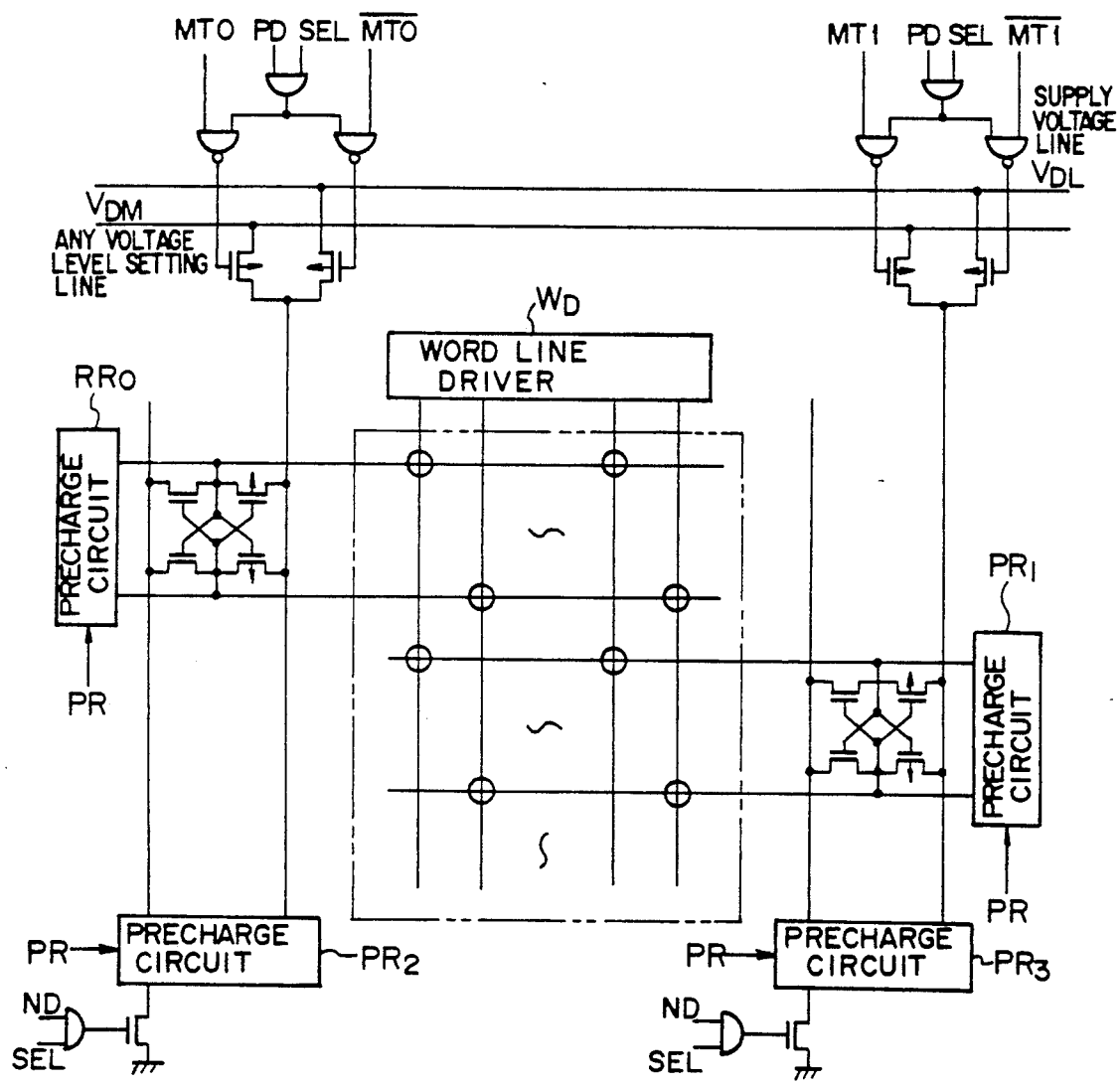
FIG. 6 shows an embodiment for writing any stored voltage to a memory cell.

FIG. 6 shows an embodiment which can set at any level the voltage level of the supply voltage line on the high voltage side of a sense amplifier which senses and amplifies the signal read from a memory cell to a data line. The write voltage level used when "1" is to be written into a memory cell is the voltage level of the supply voltage line on the high voltage side of the sense amplifier. Therefore, the voltage level of the supply voltage line on the high voltage side is required to be set to any level. Here, two kinds of supply voltage lines are provided on the high voltage side, and one of the supply voltage lines is used as $V_{DL}$ for regular writing purposes. It is arranged that the supply voltage line $V_{DM}$ can be set at any value from outside the chip. Thus if signals MT0, MT1 are rendered low, a drive signal CSP for the sense amplifier is rendered $V_{DL}$. Conversely, if signals MT0, MT1 are rendered high, a drive signal CSP for the sense amplifier is rendered $V_{DM}$. According to the present embodiment, only the voltage level for the information "1" can be set at any value. In addition, the voltage level for information "1" can be set at every other pair. Therefore, as when coupling noise between data lines is tested, a critical voltage over which information is inverted can be written at every other pair. This is also effective for margin test. This is also effective for reducing the time required for testing the information holding characteristic of a memory cell.

Figure 9:
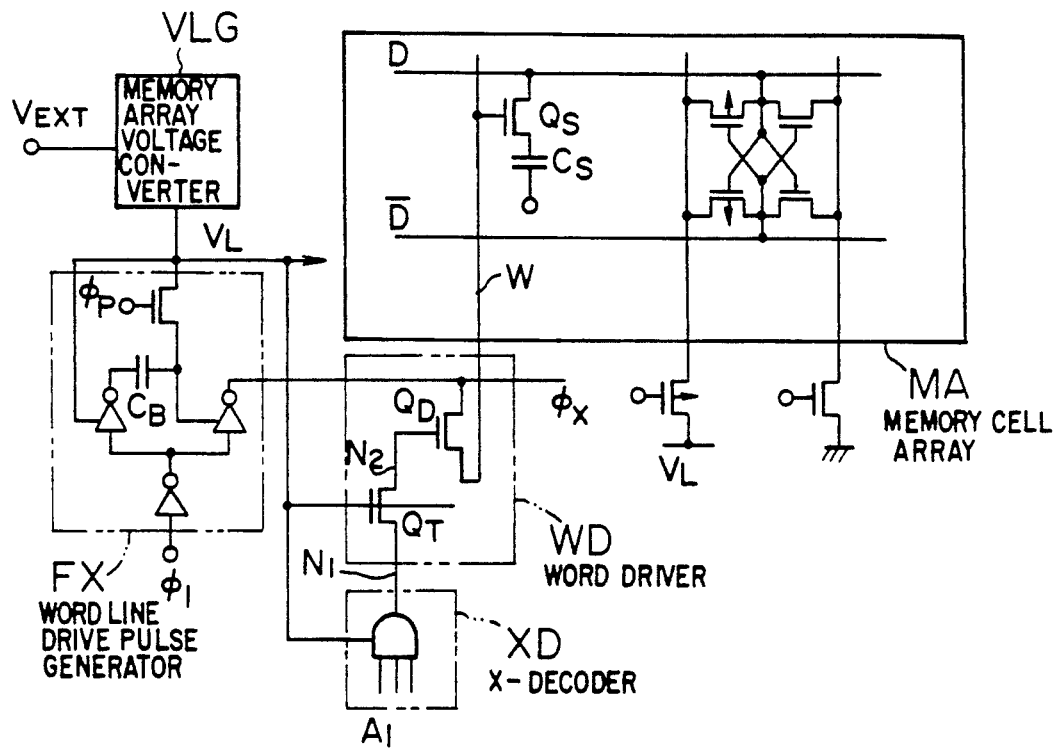
FIGS. 9 and 10 shows a prior art and its timing chart.
Figure 10:
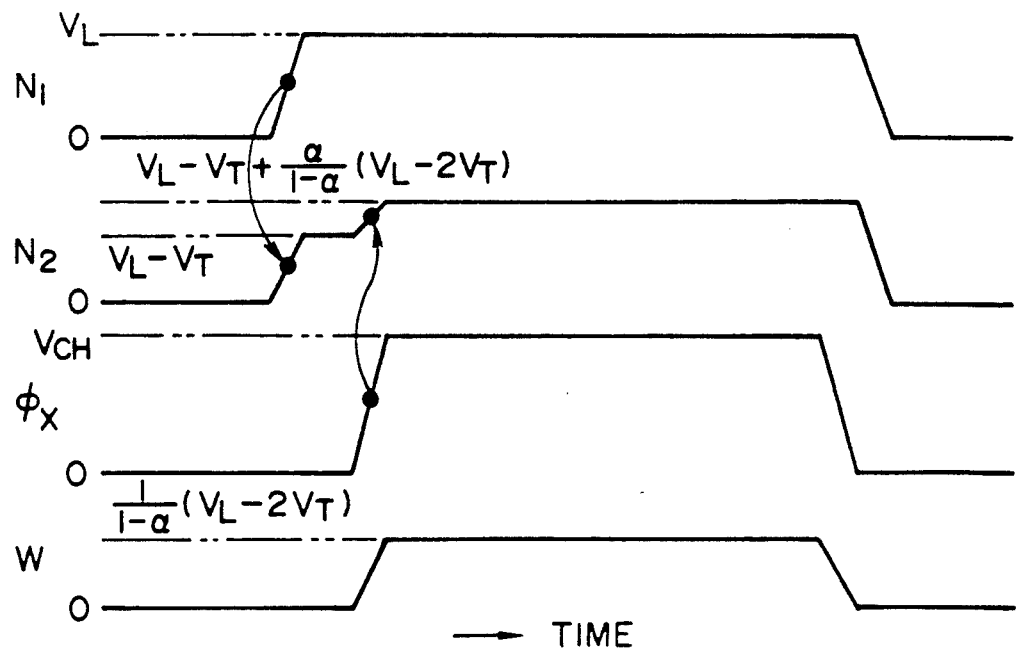

FIGS. 9 and 10 show a conventional word drive circuit.

As shown in FIG. 9, the word driver includes transistors QD and QT. When the output N1 of X-decoder XD becomes high (VL), the gate N2 of QD is charged through QT to turn on QD. At this time, the voltage of N2 becomes $VL-VT$. When a word line drive signal $\phi X$ (having an amplitude of $VL+VT$ or more) generated by a peripheral circuit FX becomes high, a current flows from the drain of QD to its source to thereby render word line W high. At this time, the voltage difference between the gate of QT and N1 is 0 and the voltage between the gate of QT and N2 is Vt, so that QT is in a cut-off state. Therefore, as $\phi X$ rises, the voltage of N2 increases with $\phi X$ due to coupling through the gate-source capacitance of QD. If the difference in voltage between the gate and source of QD is higher than VT when $\phi X$ arrives at its maximum value, the voltage on the word line becomes equal to $\phi X$. If the difference in voltage between the gate and source of QD becomes equal to, or less than, VT when $\phi X$ is rising, the gate-source capacitance of QD becomes 0 at which time the voltage of N2 stops rising and becomes $VL-VT+\alpha(VL-2VT)/(1-\alpha)$, as shown in FIG. 4. The word line voltage becomes $(VL-2VT)/(1-\alpha)$ where $\alpha$ is the ratio of the gate capacitance of QD to the overall capacitance of node N2.

Figure 7:
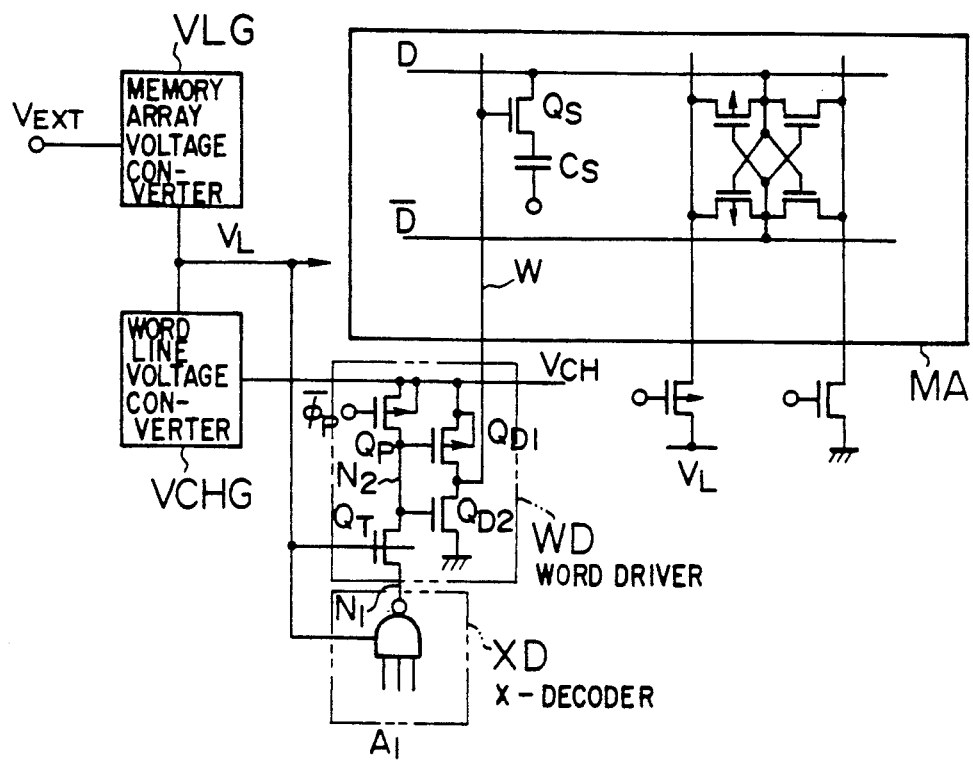
FIGS. 7, 11, 13-16, 18 and 19 show embodiments of the present invention.
Figure 8:
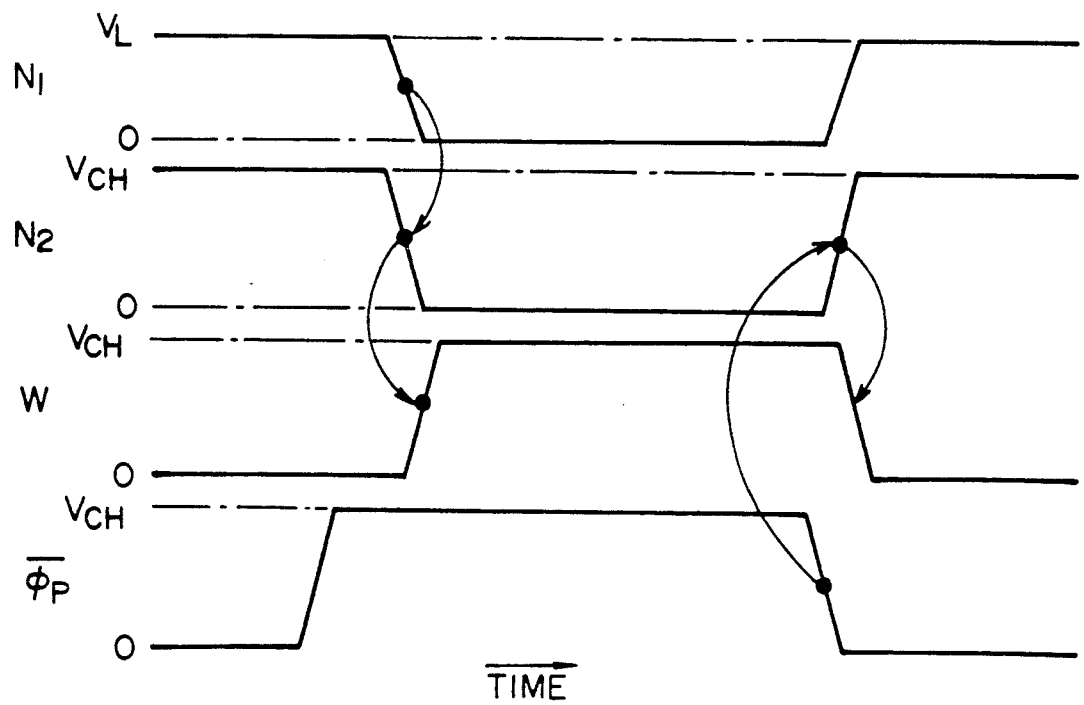
FIGS. 8, 12 and 17 are timing charts indicative of the operation of the last-mentioned embodiments.

FIGS. 7 and 8 show one embodiment of a word drive circuit according to the present invention. The present embodiment is characterized by the use of a static word driver including QD1, QD2, QP and QT instead of a conventional dynamic word driver. A voltage converter VCHG is provided as a power source which generates a voltage higher by VT of a switching transistor QS of a memory cell or more than the data line voltage VL. The operation of the embodiment will be described below. First, when X-decoder XD is selected by an address signal Ai, the output N1 of the X-decoder XD becomes low. If so, electric charges at a node of N2 are drawn through transistor QT, so that N2 becomes low. Thus, transistor QD1 is turned on to cause word line W to rise to VCH level to thereby write information into memory cell CS.

In a precharge cycle, first, $\phi P$ becomes low to thereby turn on QP and put node N2 at VCH. Thus, QD1 is turned off and QD2 is turned on, so that word line W becomes low to thereby hold electric charges in the memory cell.

As described above, in the present embodiment, the voltage of the word line can be set to the maximum VCH voltage output by word line voltage converter VCHG. Since the word drive circuit operates when the gate voltage of the drive transistor is low, the word driver operates in a stabilized manner even if the supply voltage falls.

Figure 11:
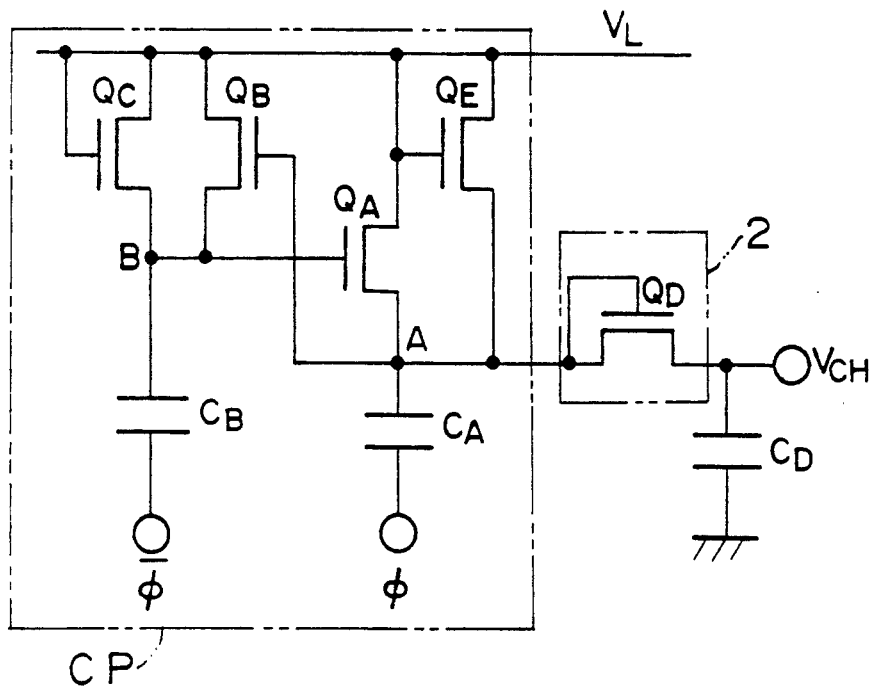
Figure 12:
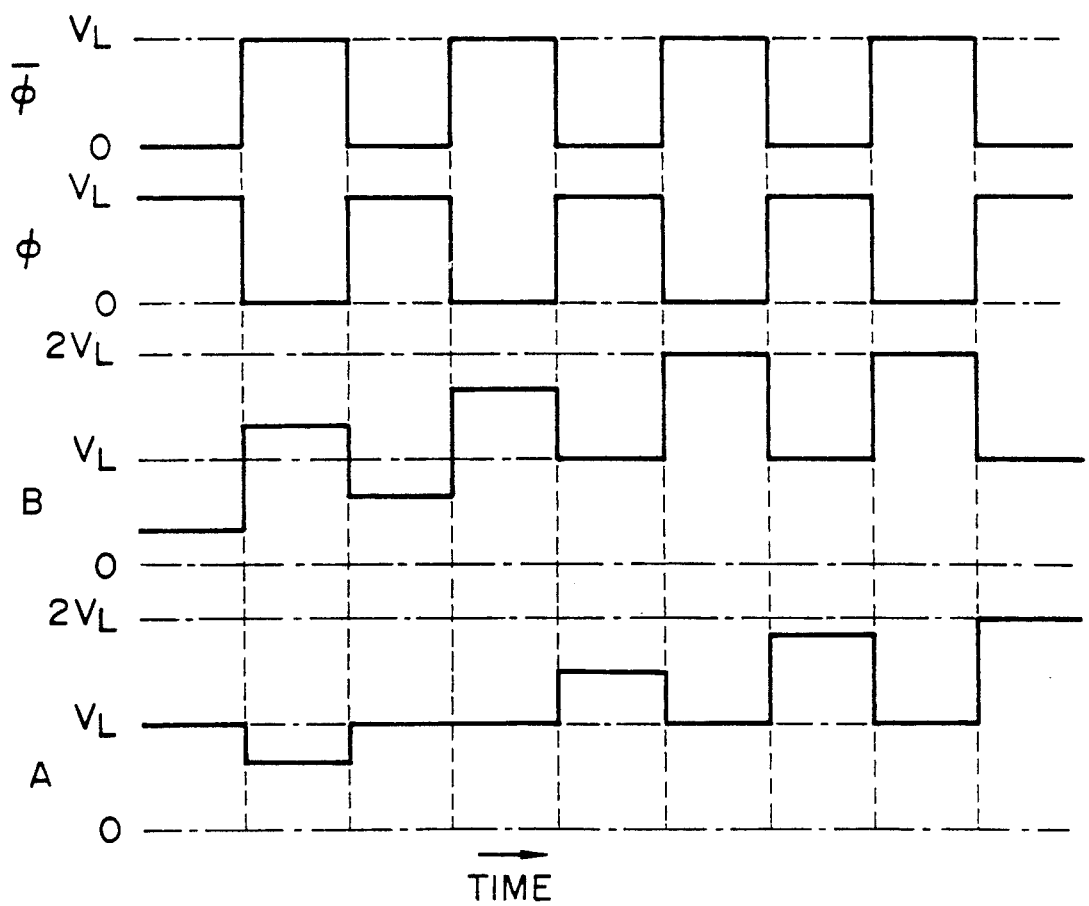

FIG. 11 shows a specified embodiment of the word line voltage converter VCHG of FIG. 7. FIG. 12 shows internal waveforms and input timing in the converter generated when it starts. The embodiment is characterized in that in order to obtain a rapid rise and high output voltage even with a low supply voltage, the charge pump circuit CP feeds its output voltage back to a precharge N-channel MOS transistor (QB of FIG. 11).

In operation, first, assume that input pulses $\phi$, $\overline{\phi}$ are high and low, respectively. At this time, the voltage at node B becomes $VL-VT$ because it is charged by internal supply voltage through QC. Node A takes the voltage value determined by the electric charges stored in capacitors CA, CD and the amplitude of $\phi$. In the present embodiment, this voltage is assumed to be VL. If $\phi$ and $\overline{\phi}$ voltages are replaced with each other, the voltage at node B is increased by capacitor CB to $VL-VT+\alpha VL$ where $\alpha$ is the ratio of CB to overall capacitance of node B. At this time, the voltage at node A takes $VL-2VT+\alpha VL$ which is VT of N-channel MOS transistor QA lower than the voltage at B.

If $\phi$, $\overline{\phi}$ are again replaced with each other, node A is again increased in voltage level. If it is higher by $\delta$ than VL at this time, N-channel MOS transistor QB is turned on to further increase the voltage at node B by $\delta$ because the voltage at node B is precharged to $VL-VT$ by N-channel MOS transistor QC. Therefore, in the next cycle, node B is further increased in voltage level and the voltage at node A is also increased. By repeating such operations, the voltage at node A increases and, finally, changes between VL and 2VL.

This output is connected to a rectifier 2 or diode connection MOS transistor QD. By connecting a smoothing capacitor CD to the output of QD, an increased DC voltage VCH results which is 2VL−VT under loadless conditions.

The circuit where QA and CA are connected is divided into twin circuits. In one of them the junction of MOS transistor QA and capacitor CA is connected to the rectifier 2 and in another one to the gate of QB, so that the gate of QB is separated from the load circuit. Therefore, the gate voltage increases by a quantity corresponding to no current flowing to the load circuit to thereby more rapidly increase the voltage at node A. (QA, QB, QC - QE are each an N-channel MOS transistor.)

The present circuit is characterized in that, as mentioned above, by feeding the output voltage back to the precharge circuit, the precharge voltage is increased to thereby provide high output voltage even with a low supply voltage. For example, if VL=0.8 volts and VT=0.5 volts, the voltage at node B is not higher than 1.1 volts (2VL−VT when α=1) if there is no feedback action or no QB. As a result, the voltage at node A is 1.4 volts (3VL−2VT) and the output voltage VCH is 0.9 volts (3VL−3VT). IN contrast, if there is QB, the voltage at node B, the voltage at node A and VCH are 1.6 volts (2VL), 1.6 volts (2VL), and 1.1 volts (2VL−VT), respectively, which are higher than the former values. It will be understood that if this high voltage generator is used as a power source for the word line drive circuit in the present invention, it is better than the conventional word line drive circuit.

Figure 20:
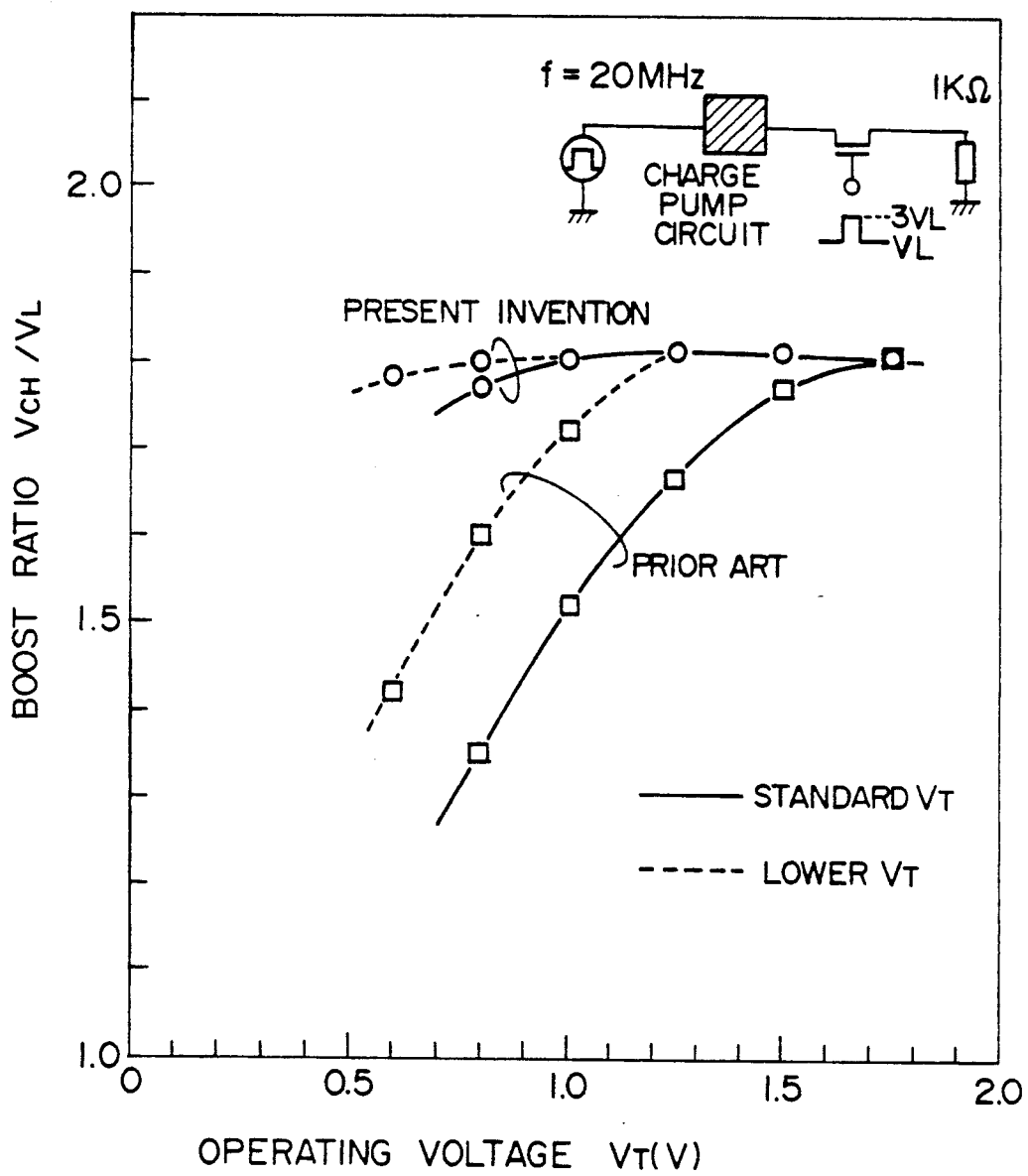
FIG. 20 shows the effects of the FIG. 11 embodiment.

FIG. 20 shows the result of comparison of the boost ratios of the word line voltage converter which includes the feedback transistor QB (present invention) and of that which includes no feedback transistor QB (conventional system). In FIG. 20, the solid line shows a case where the threshold voltage of the transistors used is standard and the broken line shows a case where the threshold voltage of the transistors is lower. It will be obvious from FIG. 20 that the boost ratios in prior art decrease rapidly at a supply voltage of 1-1.5 volts. In contrast, it will be seen in the present invention that the boost ratios are constant up to 0.8 volts and the word line voltage converter operates stably even with a low supply voltage. Assume here that there is no voltage drop due to the threshold voltage of the transistor in this rectifier.

Figure 13:
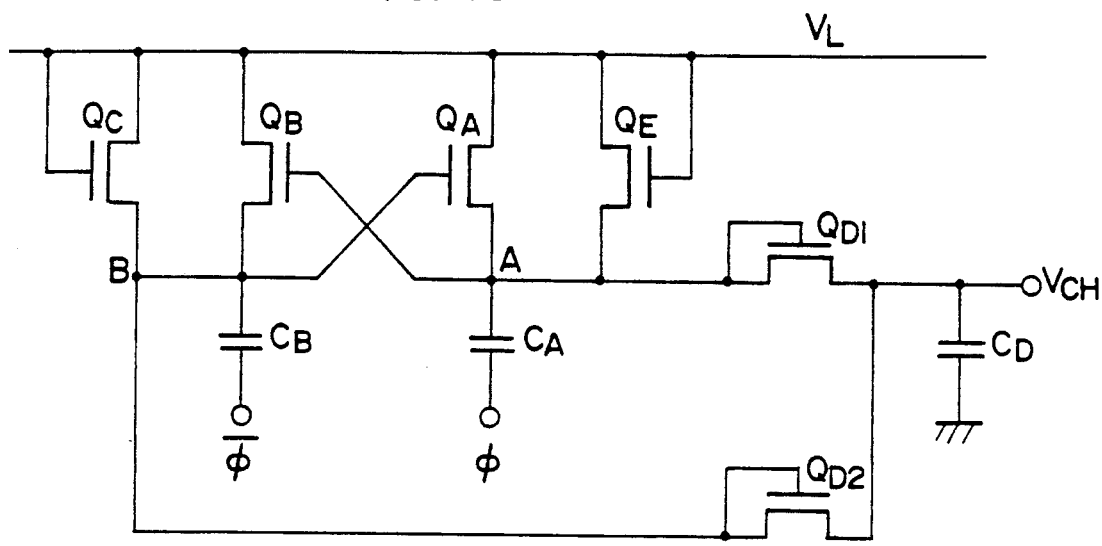

FIG. 13 shows extraction of an output also from node B of FIG. 11. The nodes A and B output about twice as high as VL by complementing each other on time base, so that a further stabilized output is obtained.

Figure 14:
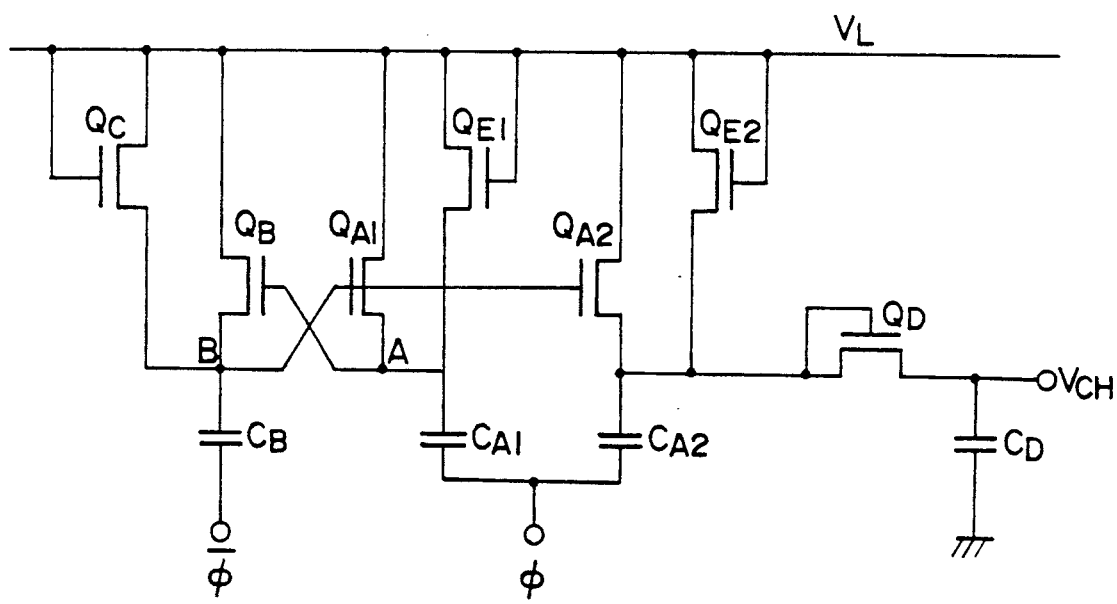

FIG. 14 shows a circuit which includes an amplification stage (QA2, QE2) provided in the circuit of FIG. 11 and which has an output separated from the gate of QB. As a result, the gate voltage of QB is prevented from being decreased by the output. The output voltage is increased twice more rapidly.

Figure 15:
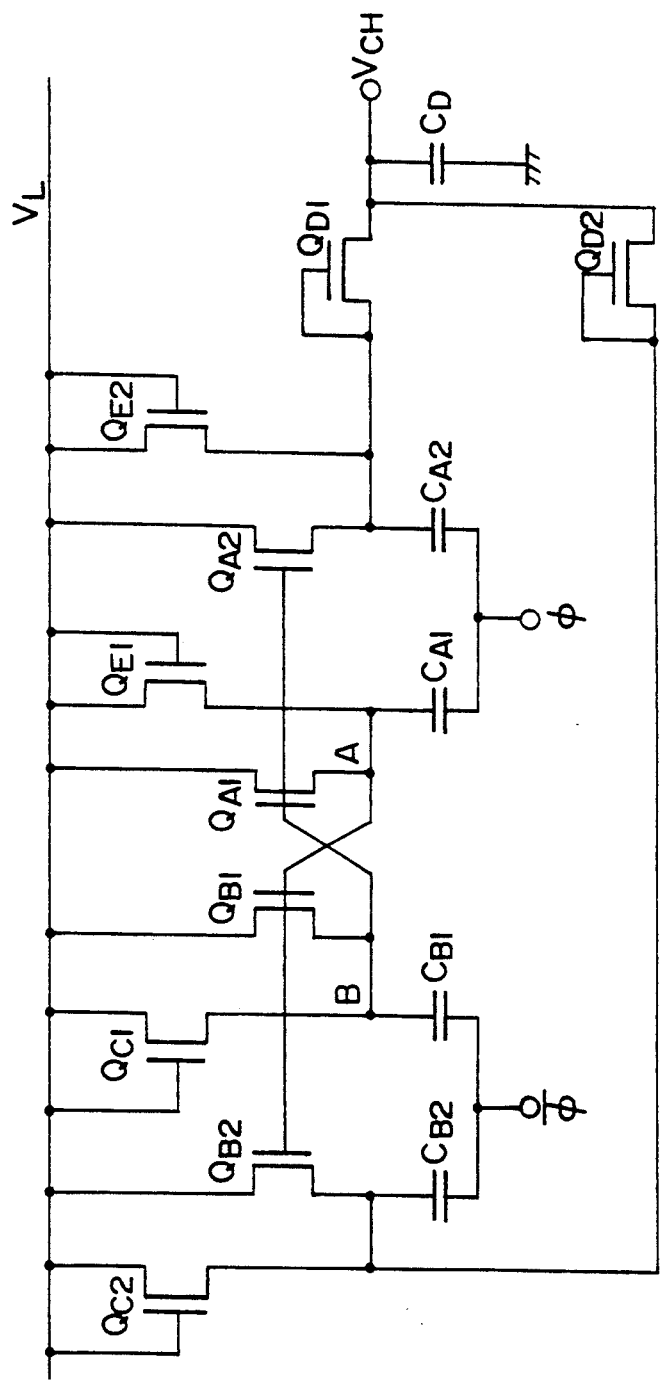

In FIG. 15, an amplifying stage (QB2, QC2) and rectifier transistor (QD2) are provided additionally in the circuit of FIG. 14 to provide a rapid increase in the output voltage and a stabilized output.

Figure 16:
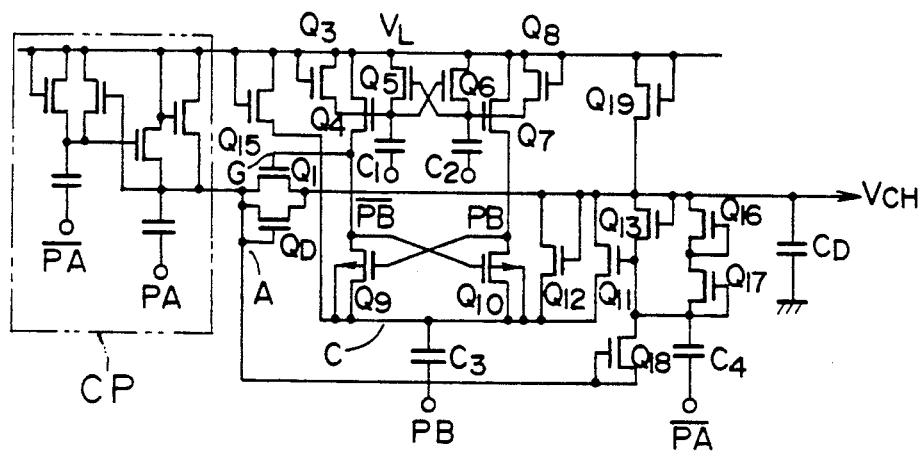
Figure 17:
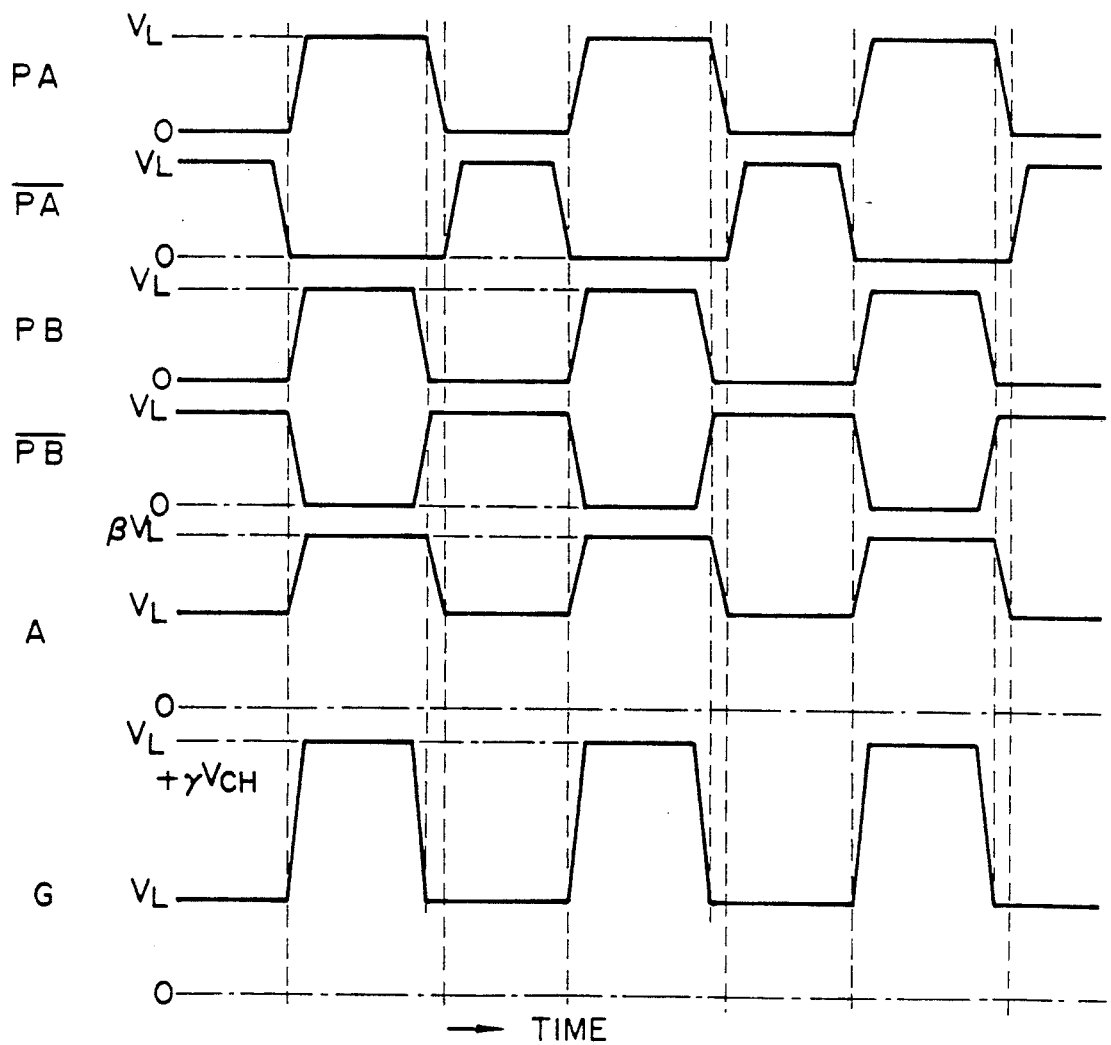

FIGS. 16 and 17 show an embodiment which includes a circuit to generate a higher output voltage using the circuit of FIG. 11. While the embodiment uses the circuit of FIG. 11 for simplifying purposes, it will be obvious that the use of the circuits of FIGS. 13-15 will produce a further higher output voltage. The present embodiment is characterized in that the gate voltage for the rectifier transistor is synchronized with the output voltage of the charge pump circuit in order to reduce a voltage drop across the rectifier transistor and that when the output is at high level (2VL), the gate voltage is higher than the output by VT or more while when the output is at low level (VL), the gate voltage is VL.

In FIG. 16, reference characters CP and QD denote the charger pump circuit and the rectifier, respectively; and Q1-Q19, C1-C4, additional elements where Q1 denotes a rectifying transistor, Q3-Q10 and C1-C3 constitute a circuit which controls the gate voltage; Q11-Q13, Q15-Q18 and C4 constitute a charger for a gate voltage boost capacitor C3; and Q19, a precharge transistor, which speeds up a rise in the VCH; PA, $\overline{PA}$, control signals to the charge pump circuit; and PB, $\overline{PB}$, control signals to the gate voltage control circuit.

In operation, the numeral 1 denotes the charge pump mentioned above. If PA, $\overline{PA}$ become high and low alternately to boost up the voltage at node A so that the voltage at node A changes between VL and βVL where β=2. At this time, it should be noted that PA, $\overline{PA}$ have no high overlapping interval as shown in FIG. 8. This is because if φ corresponding to the PA increases to the voltage at node A when $\overline{\phi}$ corresponding to the $\overline{PA}$ does not completely decrease to 0 volts and the voltage at node B is still at VL+VT or more in FIG. 5, QA is in an on-state, so that the electric charges stored in CA would leak to the power source side through QA.

In the rectifier, when PA, PB are low and $\overline{PA}$, $\overline{PB}$ are high, the gate of Q4 is raised to VL+VT or more by C1. Therefore, the voltage at the gate G of Q1 is equal to VL. At this time, the node A is at VL, so that no reverse current flows from VCH to node A. Since the gate of Q11 precharges C4 to 2VL−VT through Q13, Q18 and is then boosted up with $\overline{PA}$ (VL), so that the gate of Q11 becomes 3VL−VT. Therefore, if VL≧2VT, it is raised to VCH (2VL)+VT or more such that node C becomes VCH. At this time, since the difference in voltage between the gate and source of Q10 is VCH−VL which exceeds VT. Q10 is turned on and the gate voltage of Q9 becomes equal to the voltage at node C. Therefore, Q9 is turned off and no current flows from node C to node G.

When PA, PB become high and $\overline{PA}$, $\overline{PB}$ become low, the voltage at node A becomes 2VL and the voltage at node C become VL+VCH. Since the gate of Q7 is rasied to VL+VT or more by C3, its source voltage becomes VL; namely, the gate voltage of Q9 becomes VL. Therefore, the difference in voltage between the gate and source of Q9 becomes VCH. Thus, Q9 is turned on and the gate of Q1 becomes VL+γVCH where γ≈1. Therefore, the output does not drop by VT as does the embodiment of FIG. 11, and becomes 2VL as it is.

In the present embodiment, PB changes to low level before PA in order to prevent electric charges from flowing reversely from the output to the node A. If PB and PA change to low level simultaneously, the gate voltage of Q1 is VL+VT or more and the voltage at node A becomes VL or less. That causes flowing reversely from the output to the node A. The reason why the lowest voltage level of the gate control circuit is VL as are the sources of Q4, Q7 is to reduce the difference in voltage between the electrodes of the transistor. Thus, the difference in voltage between the transistor electrodes becomes 2VL or less, so that the same miniaturized transistors as those in the other circuits are usable.

The above is the features of the embodiment of FIG. 16. Similar effects are also produced by deleting Q7, Q10 and connecting the gate of Q9 to the gate of Q4 in FIG. 16. For example, when PB is VL, and $\overline{PB}$ is 0, the node C becomes VCH+VL, and the gates of Q4 and Q9 become VL. Therefore, Q4 is turned off, Q9 is turned on, and the node G becomes VCH+VL. When PB is 0 and $\overline{PB}$ is VL, node C becomes VCH (2VL), and the gates of Q4, Q9 become 2VL. Therefore, Q4 is turned on, Q9 is turned off and node G becomes VL.

Figure 18:
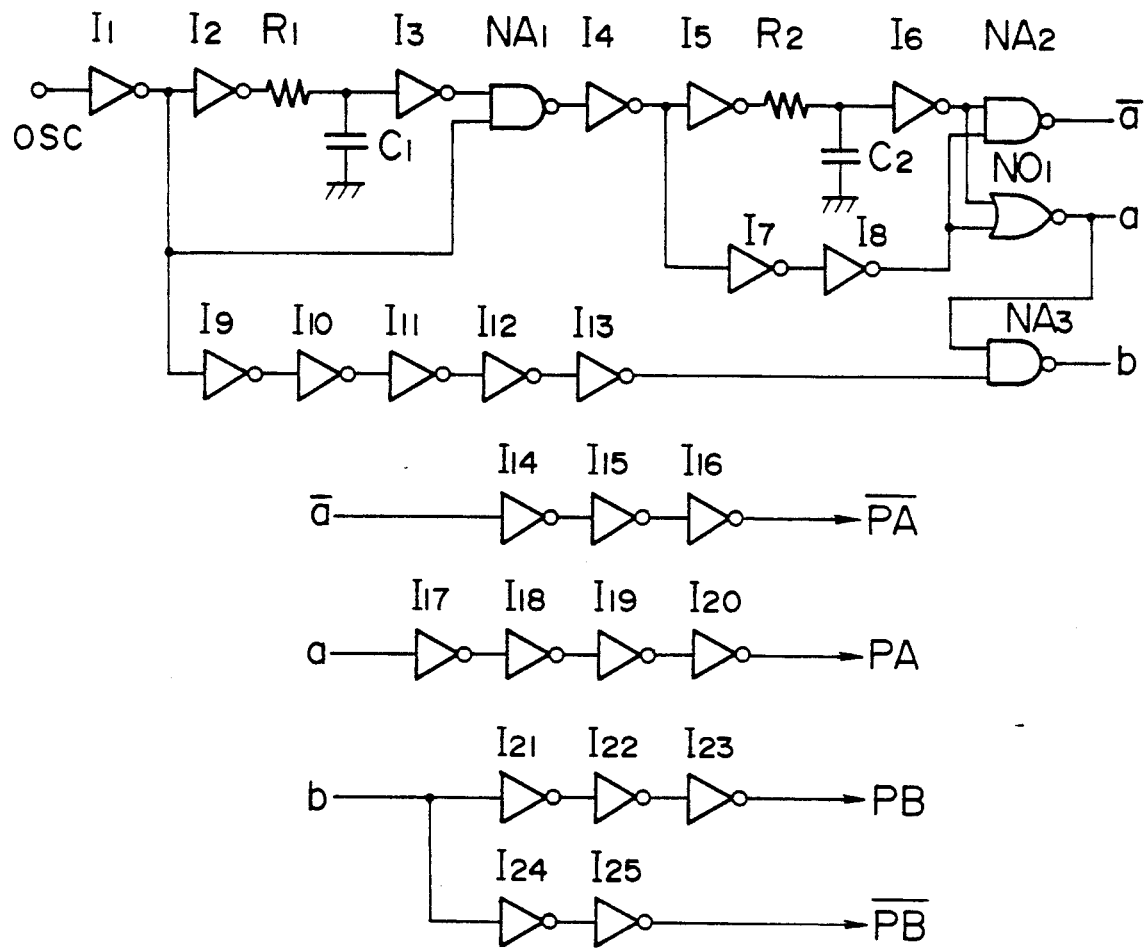
Figure 19:
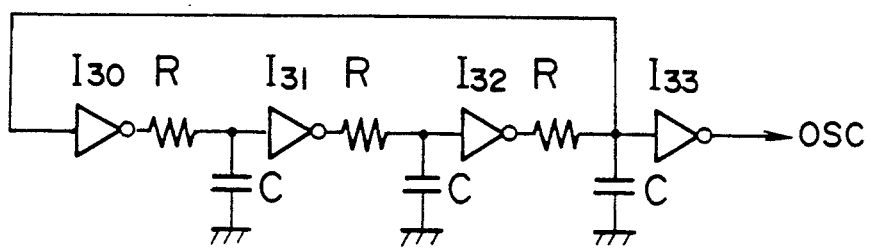

FIGS. 18, 19 show a circuit to generate timing signals used in FIG. 17. In FIG. 18, inverters I5-I8, resistor R2, capacitor C2, NAND gate NA2, and NOR gate NO1 constitute a circuit to prevent overlapping of PA, $\overline{PA}$; I2, I3, R1 and C1 constitute a circuit to determine a fall delay time of PA and PB; I9-I13 and NA3 constitute a circuit to generate a fall delay of PA and PB; and I14-I25, a buffer inverter. The number of buffer inverter stages is optional as long as it is odd or it is even when required. The number of inverter stages is only required to be adjusted in accordance with the magnitude of the load. FIG. 19 shows an illustrative circuit to generate a pulse OSC for input to the circuit of FIG. 18 and is generally called a ring oscillator. The present circuit is characterized by selection of the time constant of RC which is sufficiently large compared to the delay time of the inverter in order to suppress fluctuations of the oscillating frequency due to fluctuations of the supply voltage. Therefore, the oscillating frequency is stabilized even if the ratio of VT of the transistors to the supply voltage is ⅓ or more and the delay time of the inverter greatly depends on the supply voltage.

The operation of the memory with low voltage is further stabilized by reducing the VT of the transistors of the embodiments of FIGS. 11 and 16 in addition to the above measures. This is because the driving capability of the transistors increases due to a decrease in the VT. The sub-threshold current increases due to a decrease in the VT. However, since the voltage converter includes tens of elements at most, so that the sub-threshold current is substantially negligible when the entire chip is considered. The driving capacity of the word driver and memory cell transistors increases also due to a decrease in the VT. However, the former uses not less than $10^3-10^4$ in M-bit class DRAMs, so that a leak current which flows when the transistors are off cannot be neglected. In the latter, the time when the electric charges are held decreases and the intervals at which refreshment is made must be decreased. This leads to an increase in the power consumption. Therefore, the best setting is that VT is low in the voltage converter, that VT is standard in the word driver and that VT is high compared to the standard in the memory cell.

FIG. 20 illustrates the comparison of the present invention and the conventional system. As will be obvious in FIG. 20, the boost ratio in the present invention is high compared to that in the conventional system under a low supply voltage.

As described above, according to the present embodiment, the gate voltage of the rectifier transistor can be set to a value higher than the drain voltage of the rectifier transistor by the threshold voltage VT or more. In addition, a reverse current of electric charges is prevented, so that the output voltage is increased to 2VL which is a theorectical value of a voltage doubler. The oscillating frequency and a delay time between timings are stabilized in spite of fluctuations of the supply voltage by using an oscillator and a timing generator each of which uses a RC delay. Therefore, the efficiency of voltage conversion can be kept at its best value at all times. Three kinds of VTs of the transistors are provided such that VT is low in the voltage converter, that VT is a standard in the word driver and that VT is higher than the standard in the memory cell. Thus, stabilization and speedup of the operation with a low supply voltage and an increase in the operating speed and reduction in the power consumption are achieved. Therefore, a semiconductor integrated circuit is realized which operates in a stabilized manner with an electromotive force produced by a single battery as the supply voltage.

An intermediate voltage generator used in the present invention will be described below. In the following description, VCC is used as a sign which expresses a higher supply voltage. However, VCC is not necessarily required to differ from VL used so far and may be replaced with VL. HVC is used as a sign which expresses an intermediate voltage. However, it is not necessarily required either to differ from HVL used so far and may be replaced with HVL.

Figure 21A:
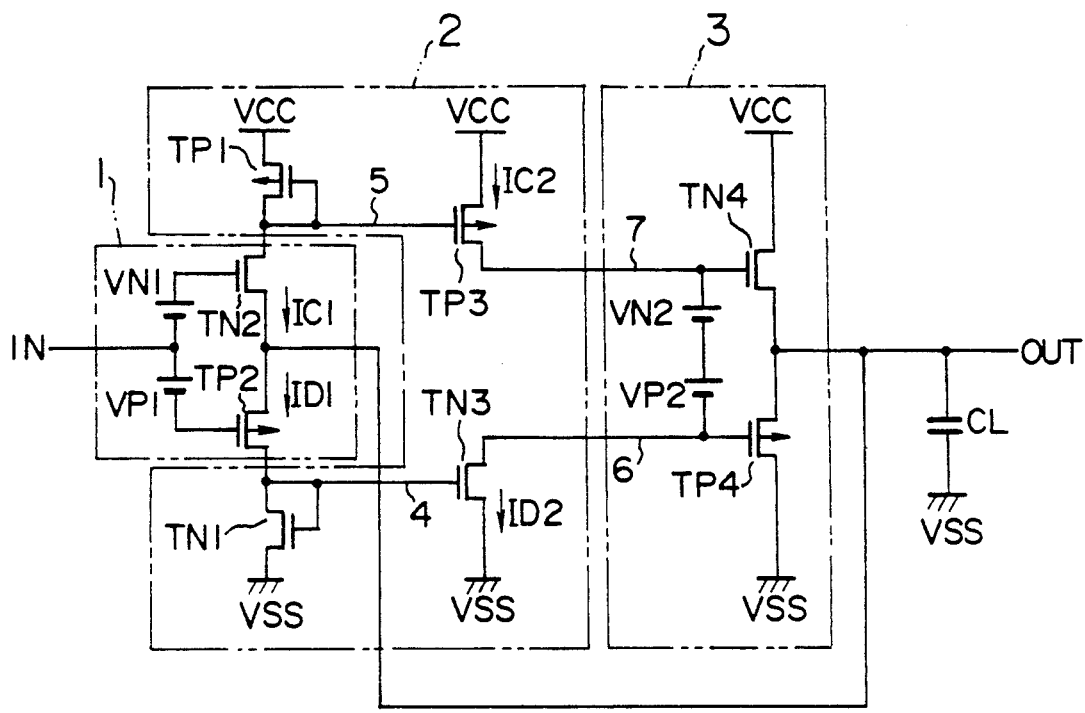
FIG. 21A shows an embodiment illustrating the basic concept of an intermediate voltage generator of the present invention.
Figure 21B:
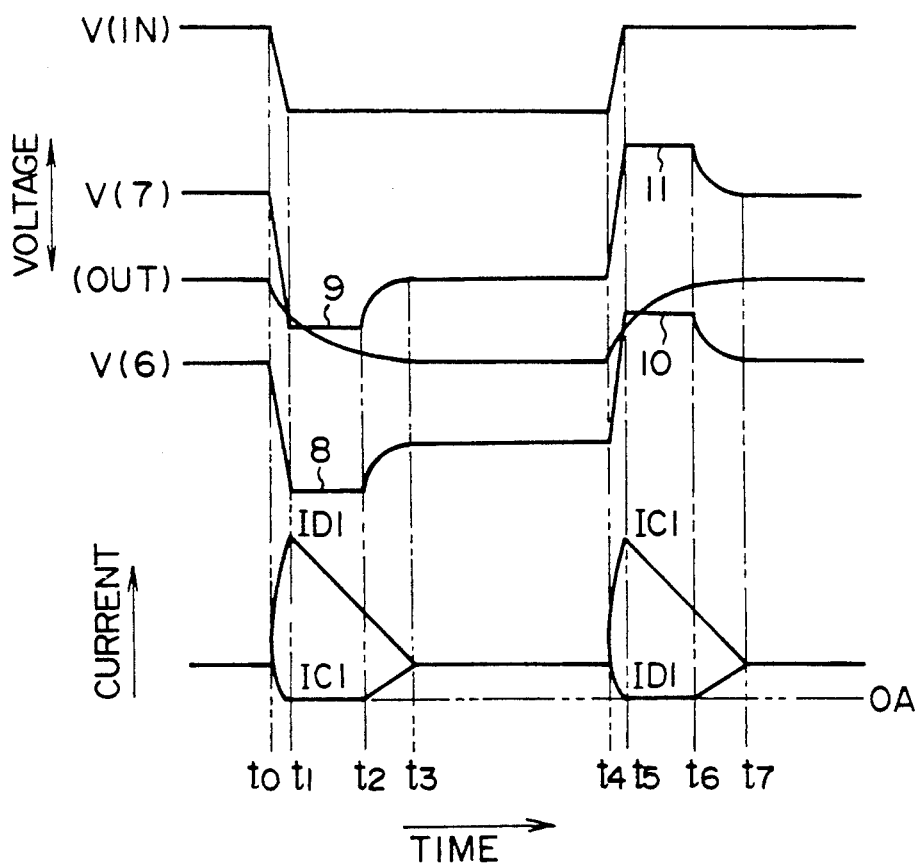
FIG. 21B illustrates the transient operation of the generator of FIG. 21A.
Figure 22:
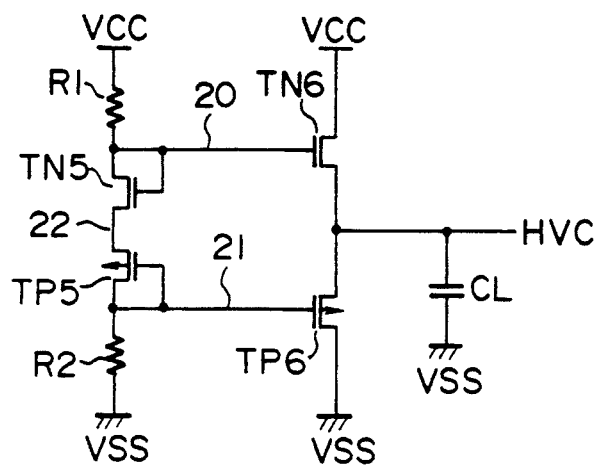
FIG. 22 shows a conventional intermediate voltage generator for a DRAM.

FIG. 21 illustrates the structure of a voltage follower which outputs a voltage substantially equal to a voltage received its input to drive large load capacitance. FIG. 22 shows a conventional structure which does not provide enough current output when the load capacitance increases due to an increase in the density of LSI. It has a low drive capability, so that its output voltage fluctuates largely. Now the present invention will be described. In FIG. 21A, the numeral 1 denotes a first complementary push-pull circuit which includes an N-channel MOS transistor TN2 and a P-channel MOS transistor TP2 and bias voltage sources VN1, VP1. The numeral 2 denotes a current mirror push-pull amplifier which includes a pair of N-channel MOS transistors TN1, TN3 to constitute a current mirror circuit and a pair of P-channel MOS transistors TP1 and TP3 to constitute another current mirror circuit. The numeral 3 denotes a second complementary push-pull circuit which includes an N-channel MOS transistor TN4 and a P-channel MOS transistor TP4 and bias voltage sources VN2, VP2.

Settings of constants for various transistors and of voltage sources of this circuit and the steady-state operation of the circuit will be described now. The values of the supply voltages VN1 and VP1 are selected so as to be substantially equal to the gate threshold voltages of the transistors TN2 and TP2, respectively. Thus, cutting off transistors TN2 and TP2 simultaneously is avoided under any operating conditions. Thus, the output impedance is prevented from increasing to fluctuate the voltage level or the output voltage is prevented from fluctuating due to the load conditions. The value of the supply voltage is made substantially equal to the gate threshold voltage of the transistors. Thus, the current flowing through the two transistors in the steady state is suppressed to a low value. Power consumed when the integrated circuit is on standby is reduced and high load drive capability is provided. The operation of the transistors under such bias conditions is generally called an AB-class operation. The values of currents flowing through TN2 and TP2, designated by IC1, ID1, respectively, are converted to currents IC2, and ID2 which flow through TP3 and TN3, respectively, by current mirror circuits which include a pair of P-channel MOS transistors TP1 and TP3, and a pair of N-channel MOS transistors TN1 and TN3, respectively. The ratio in current of IC2 to IC1 is substantially equal to the ratio in $\beta$ of transistors TP3 to TP1 while the ratio in current of ID2 to ID1 (mirror ratio) is substantially equal to the ratio $\beta$ in of transistor TN3 to TN1, namely, $$M_P = \frac{IC2}{IC1} = \frac{\beta_{TP3}}{\beta_{TP1}}$$

$$M_N = \frac{ID2}{ID1} = \frac{\beta_{TN3}}{\beta_{TN1}}$$

By setting the ratios to values larger than 1 (unity), the currents are amplified and the driving capabilities for the next stage load (terminals 6, 7) are increased. In the present circuit, these ratios are selected to be about 1-10. The values of the supply voltages VN2 and VP2 are selected so as to be substantially equal to the gate threshold voltages of the transistors TN4 and TP4, respectively, as in the first complementary push-pull circuit. Thus, the second complementary push-pull circuit also performs an AB-class operation.

What will occur if the first complementary push-pull circuit deviates from its steady state in which IC1=ID1 will be described below. The current value produced when the output voltage is changed forcedly by a voltage $\delta V$ from its steady state is expressed as follows:

$$IC1 - ID1 = -(\sqrt{2\beta_N I} + \sqrt{2\beta_P I}) \times \delta V + \frac{(\beta_N - \beta_P)}{2} \delta V^2$$

where $\beta_N$ and $\beta_P$ are the values of $\beta$ of transistors TN2 and TP2, respectively, and I is the current flowing through the first complementary push-pull circuit in the steady state where I=IC1=ID1.

Now, for simplifying purposes, assume that the characteristics of TN2 and TP2 are substantially the same or $\beta_N$ and $\beta_P$ are equal ($\beta = \beta_N = \beta_P$). The above equation is then modified to:

$$IC1 - ID1 \approx -2\sqrt{2\beta I} \times \delta V$$

Assuming that the mirror ratios of the two current mirror circuits are equal ($M = M_N = M_P$), $$IC2 - ID2 \approx -2 \times M \times \sqrt{2\beta I} \times \delta V$$

For example, if M=5, $\beta=1$ mA/V$^2$, and I=0.2 $\mu$A, IC2−ID2=20 $\mu$A when the output voltage decreases by 0.1 volts ($\delta V = -0.1$ volts).

When the output voltage changes slightly or by 0.1 volts, a drive current of 20 $\mu$A sufficiently large compared to the steady state current 1 $\mu$A (0.2 $\mu$A×5) of IC2 and ID2 is obtained. Therefore, the terminal 6 can be driven to the minimum VSS and the terminal 7 to the maximum VCC even for a slight change in the output voltage. Namely, the complementary push-pull circuit 3 can be driven to the upper and lower limits of the supply voltage. The driving directions are such that when the output voltage decreases, the terminal 7 is driven to VCC while when the output voltage increases, the terminal 6 to VSS. Thus, if the output voltage involves an error, the amplified error signal drives the second complementary push-pull circuit to thereby eliminate an error involved in the output voltage. Therefore, compared to the conventional system which is driven only by a source follower, the inventive system has a greatly high driving capability. Even if the steady-state bias current is suppressed to a sufficiently low value, a high driving current is obtained by amplifying the error. As will be easily understood from the above equations, this circuit operates symmetrically with respect to the sense of the error, so that the same driving capability is obtained for output charging and discharging. The accuracy of the present circuit as the voltage follower will be described. The present circuit detects an error in the output voltage using the first complementary push-pull circuit. The secondary complementary push-pull circuit is driven with the amplified detected error signal. Therefore, the accuracy of the output voltage (the difference between the input and output voltages) is determined by the voltage accuracy (the difference between the input and output voltages) of the first complementary push-pull circuit. If the conditions are sought where the steady state or IC1=ID1 holds in the first complementary push-pull circuit, the relationship between the input voltage V (IN) and output voltage V (OUT) is given by $$V(OUT) - V(IN) = \frac{\beta_R \times (VN1 - VTN) - (VP1 - VTP)}{\beta_R + 1}$$

where $$R = \sqrt{\beta_{TN2}/\beta_{TP2}}$$

and VTN and VTP are the absolute values of the gate threshold voltage of the N- and P-channel MOS transistors. As will be obvious from this equation, VN1 and VP1 are caused to have characteristics which change following changes in VTN and VTP, respectively. Alternatively, the value $\beta$ of the transistors are selected appropriately. By doing so, the difference in voltage between the output and input can be made to 0 even if the element characteristics of the N- and P-channel transistors change separately, for example, due to uneven manufacturing processes. The above supply voltage will be described in the next embodiment. The gates and drains of the respective channel-conductive type MOS transistors are connected. The above supply voltage is easily constructed by causing predetermined currents to flow through the MOS transistors. Generally, transistors of the same conductive type pass through the same manufacturing processes. Therefore, even if elements of different conductive types vary in characteristic, the difference in characteristic between the elements is suppressed to a sufficiently small value. Especially, the gate width and length are designed so as to have sufficiently large values compared to the working accuracy in consideration of uneven processed configurations. Thus, the difference in characteristic between the elements is further reduced. A gate threshold voltage will be taken as an example. The difference between elements of the same conductive type can be easily reduced to about 20-30 mV or less, usually among elements of different conductive types, variations in the difference reach about 200 mV at a maximum, which is large by one order of magnitude compared to elements of the same conductive type. As described above, the voltage accuracy (the difference between the input and output voltages) of the first complementary push-pull circuit is suppressed to about 20-30 mV determined by the difference between the threshold values of the transistors and those values are low about by one order of magnitude compared to the conventional system.

The transient operation of the voltage follower will be described with reference to FIG. 21B. Assume now that the input voltage V(IN) falls from time t0 to t1 and rises from time t4 to t5. Since the output does not immediately follow a fall in the input voltage, the transistor TN2 is put in a cut-off state from time t1 to t2 and the value of current IC1 is substantially 0. In contrast, ID1 increases to lower the voltage V(6) at terminal 6 to substantially VSS (OV). Thus, the driving capability of transistor TP4 increases to thereby discharge the output OUT at high speed. When the difference between the output and input voltages is reduced after time t2, the transistor TN2 starts to conduct. At time t3 when the difference between the input and output voltages is finally reduced to 0, IC1=ID1, so that the steady state results. When the input voltage increases, the voltage at terminal 7 increases to VCC symmetrically with the increase in the input voltage to thereby charge the output at high speed.

As described above, the present intermediate voltage generator reduces an error between the input and output voltages even if the transistors vary in characteristic due to their manufacturing processes. It also provides a voltage-follower circuit which is able to charge/discharge a large capacitance load at high speed in a transient time. In addition to the application of a voltage-follower circuit, the present circuit may be used as a high-quality current detector by supplying a signal current to the output terminal OUT and extracting the output from terminal 6 or 7.

Figure 23A:
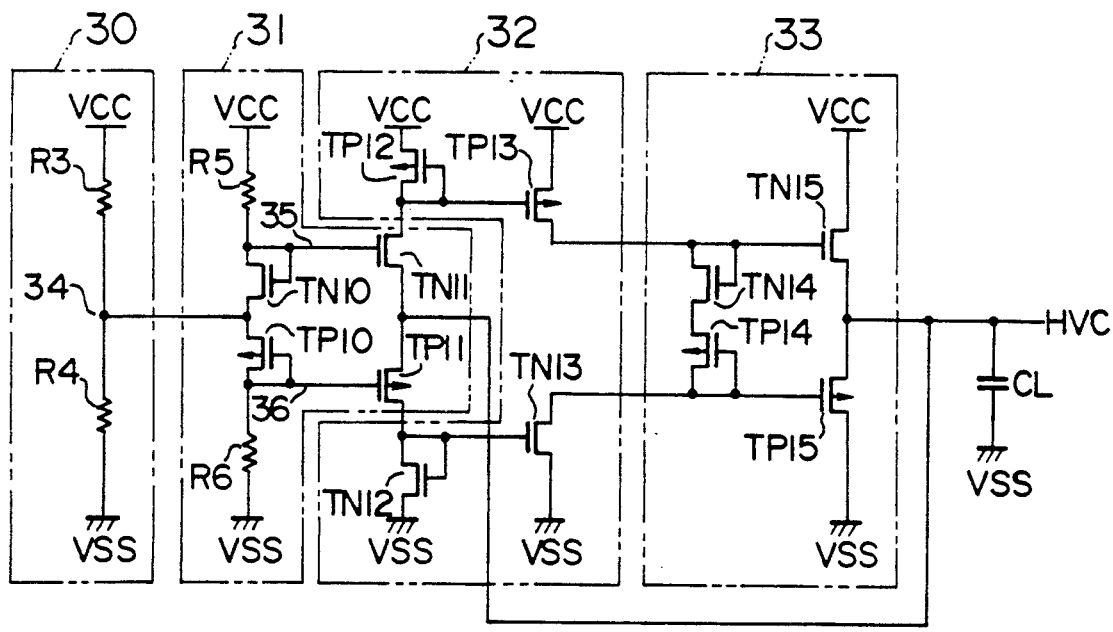
FIG. 23A shows a specified embodiment of a DRAM which uses the intermediate voltage generator in the present invention.

Referring to FIG. 23, an embodiment of an intermediate voltage (VCC/2) generator system of a dynamic memory to which the above-mentioned circuit is applied will be described. FIG. 23A illustrates the structure of the specified intermediate voltage generator. In FIG. 23A, the numeral 30 denotes a reference voltage generator; 31, first complementary push-pull circuit; 32, current mirror type amplifier; and 33, second complementary push-pull circuit. The reference voltage generator generates an intermediate voltage at terminal 34 by dividing the supply voltage into halves with two resistors R3 and R4 having the same resistance value. By using the same kind of elements as the resistors R3 and R4, an intermediate voltage having a considerably high accuracy is obtained. The elements to obtain the intermediate voltage are not limited to resistors. It is obvious that a similar circuit can be composed, for example, of MOS transistors. The first complementary push-pull circuit is basically the same as the push-pull circuit 1 of FIG. 21A. In the present circuit, resistor R5 and N-channel MOS transistor TN10 are used in place of voltage source VN1, and resistor R6 and P-channel MOS transistor TP10 in place of voltage source VP1. By doing so, as mentioned above in the previous embodiment, the voltage at terminal 35 is invariably set automatically to a value substantially higher by the threshold voltage of the N-channel MOS transistor than the voltage at the input terminal 34. The resistance values of R5 and R6 are selected such that the currents flowing through R5 and R6 have small values which are between ½ and 1/10 of the currents flowing through R3 and R4 such that the voltage at terminal 34 is not influenced and fluctuated by fluctuations of the value of the current flowing from the push-pull circuit to the reference voltage generator fluctuates due to separate fluctuations in the characteristics of the N- and P-channel transistors. The current mirror amplifier 32 has exactly the same structure as the current mirror amplifiers 2 of FIG. 21A. The second complementary push-pull circuit is basically the same as the push-pull circuit 3 of FIG. 21A. In FIG. 23A, N-channel MOS transistor TN14 is used in place of voltage source VN2, and P-channel MOS transistor TP14 in place of voltage source VP2. By doing so, the values of the bias currents flowing through the push-pull circuit are not fluctuated by changes in the threshold voltages of the transistors. By taking such structure configuration, high accuracy intermediate voltage is obtained at output HVC. In addition, the load capacitance CL can be charged/discharged at high speed.

Figure 23B:
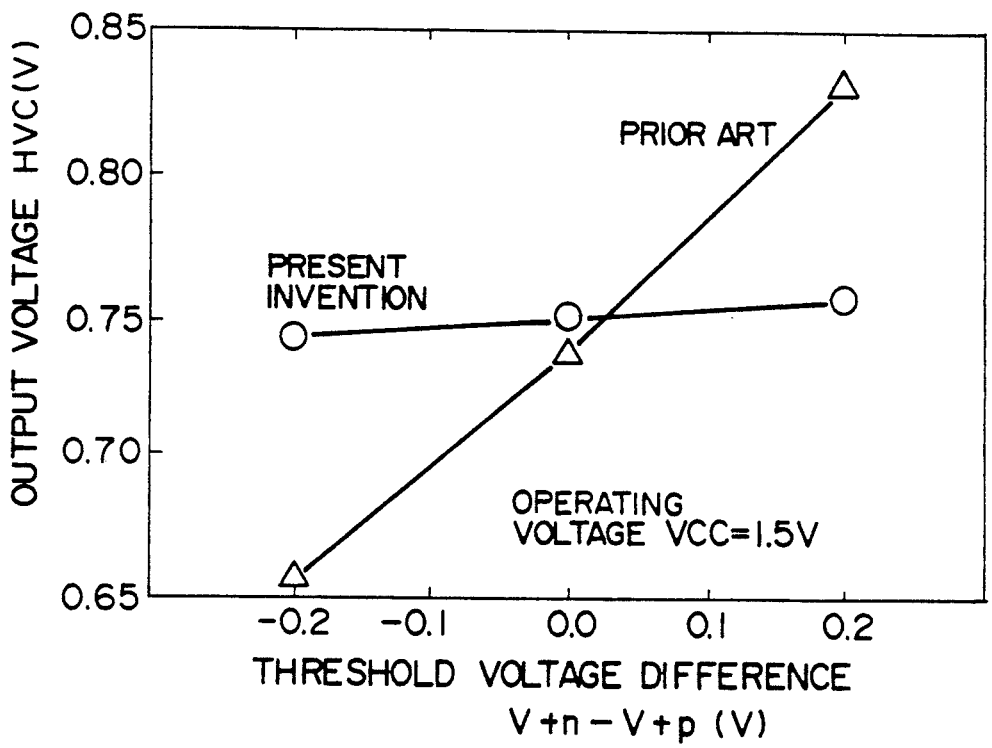
FIGS. 23B and 23C illustrate the effects of the intermediate voltage generator in the present invention.
Figure 23C:
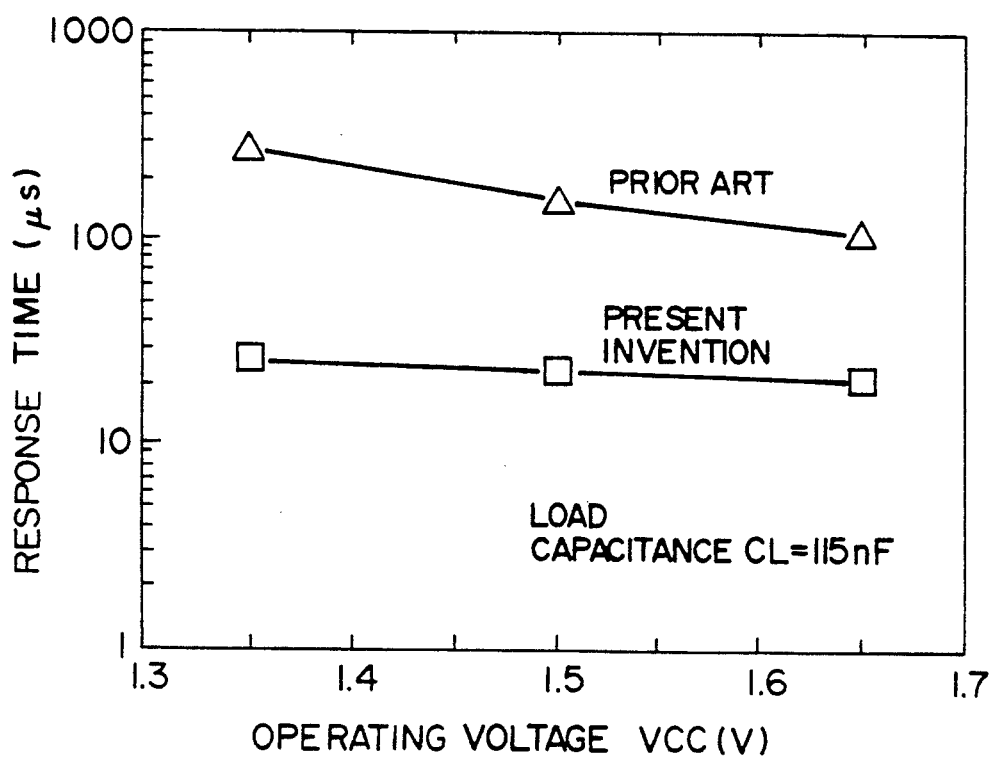

FIGS. 23B and C show the result of comparing the performances of the inventive circuit system of FIG. 23A and the conventional circuit system of FIG. 22, obtained by computer analysis. In FIG. 23B, the axis of abscissas represents the difference in absolute value between the gate threshold voltages of the N-and P-channel transistors and the axis of ordinates the value of an intermediate voltage. It will be seen from the results that when the threshold voltage difference changes by ±0.2 volts in the conventional circuit, its output voltage fluctuates by about ±100 mV (about ±13% for 0.75 volts). In contrast, the output voltage of the inventive circuit changes by about ±8 mV (about ±1% for 0.75 V), which is reduced by one order of magnitude or more compared to the conventional system. FIG. 23C is a graph of a rise time of the output voltage after the power source is turned on and plotted versus supply voltage. The rise time is defined as a time when the output voltage reaches 90% of its steady state value since the power source is turned on. It is assumed that the value of the load capacitance is the total sum of the capacitance of a power source for precharging a bit line of a 64M bit-DRAM and the capacitance of the plate electrode. As will be seen from the result of the analysis, the use of the present intermediate voltage generator serves to start up the load in a time which is shorter by about one order of magnitude compared to the conventional circuit.

Figure 24A:
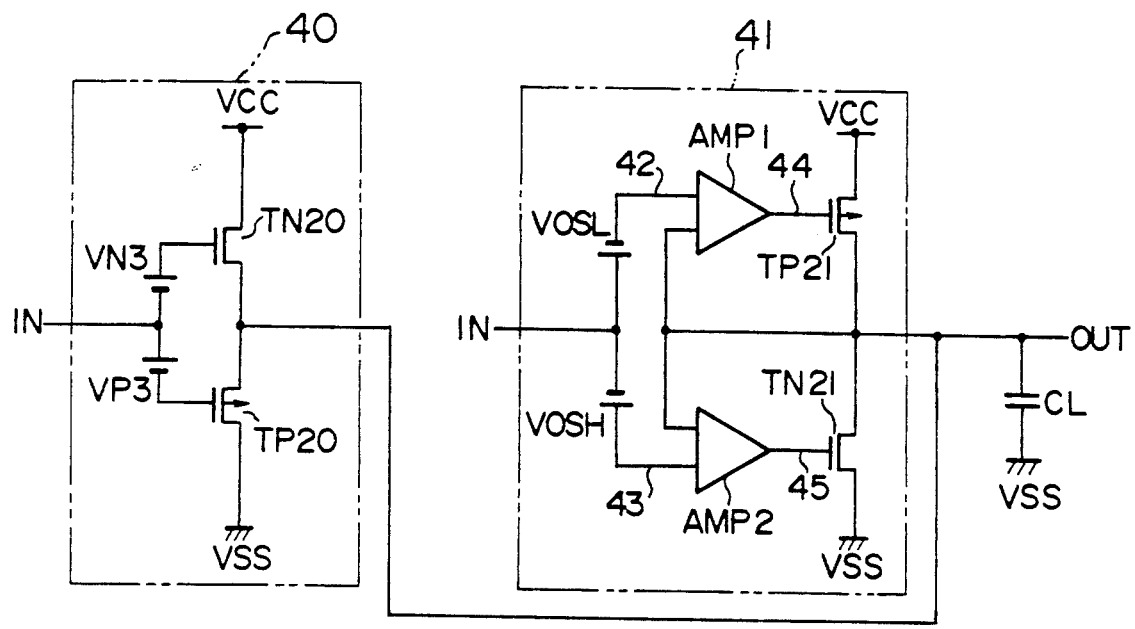
FIG. 24A shows an embodiment which illustrates another basic concept of the intermediate voltage generator in the present invention.

FIG. 24A is a circuit diagram of another intermediate voltage generator. In FIG. 24A, the numeral 40 denotes a complementary push-pull voltage follower; and 41, a tri-state buffer. The voltage follower is basically the same as the complementary push-pull circuit 1 of FIG. 21A. In FIG. 24a, the tri-state buffer operates so as to compensate for the driving capability of the push-pull circuit. The tri-state buffer includes P- and N-channel transistors TP21 and TN21 for load driving purposes, two differential amplifiers (comparators) APM1 and APM2 which drive those transistors, and two supply voltages VOSL and VOSH to set offset quantities. The operation of this circuit is determined depending on which of the following three voltage conditions holds:

(1) V(OUT)>V(IN)+VOSH
(2) V(IN)+VOSH>V(OUT)>V(IN)−VOSL
(3) V(IN)−VOSL>V(OUT)

Figure 24B:
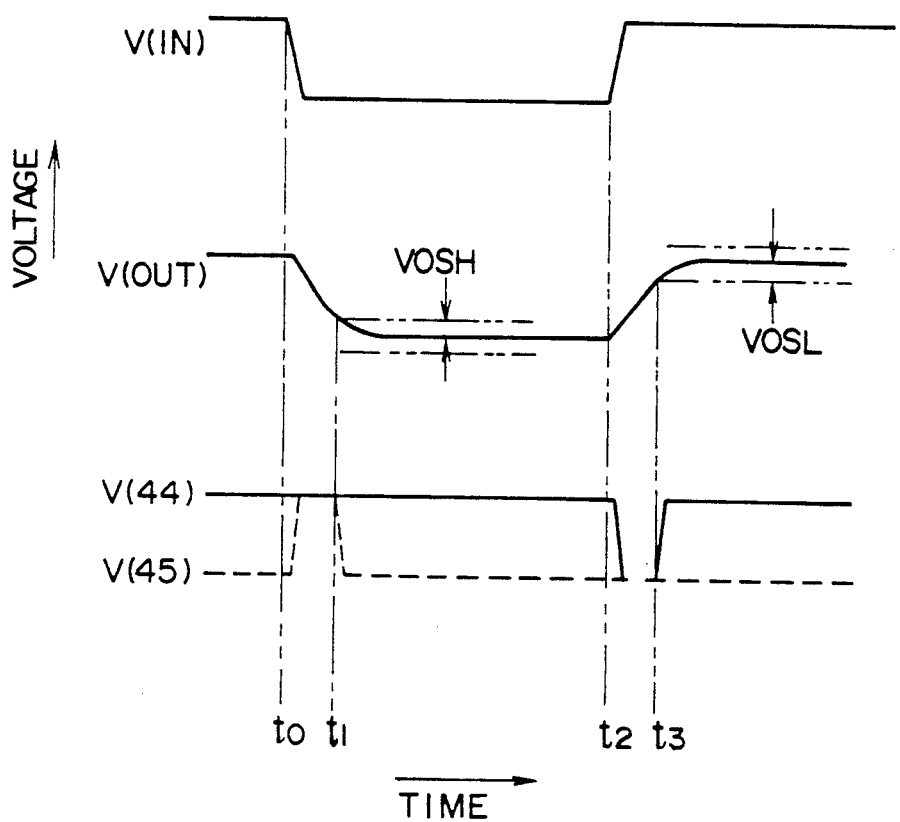
FIG. 24B illustrates the operation of the just-mentioned intermediate voltage generator.

In the voltage conditions of (1), the voltage at output OUT is higher than the voltage at terminal 43, so that the voltage at terminal 45 becomes high (VCC). The voltage at terminal 44 also becomes high (VCC). Therefore, N-channel transistor TN21 is made conductive and P-channel transistor TP21 made cut off to cause the load to be discharged. In the voltage conditions of (2), the voltage at output OUT is lower than the voltage at terminal 43, so that the voltage at terminal 45 becomes low (VCC). The voltage at terminal 44 is maintained high (VCC). Therefore, the two transistors TN21 and TP21 are both cut off and the output is put at high impedance. In the voltage conditions of (3), the voltage at output OUT is lower than the voltage at terminal 42, so that the voltage at terminal 44 becomes low (VSS). The voltage at terminal 45 is maintained low (VSS). Therefore, N-channel transistor TN21 is cut off while P-channel transistor TP21 is made conductive to charge the load. As just described above, when the output voltage increases beyond a predetermined range the center of which is the input voltage, the load is discharged while if the output voltages is reduced below the predetermined range, the load is charged. If the output voltage is within the predetermined range, the load is neither discharged nor charged; namely, a drive circuit having three states (tri-state) is realized. The transient operation of this circuit is shown in FIG. 24B. Assume now that the input voltage V(IN) falls at time t0 and rises at time t2. When the input voltage falls, the voltage at terminal 45 is VCC from time t0 to time t1 when the output voltage becomes equal to "(steady state voltage)+VOSH" to thereby render transistor TN21 conductive to discharge the load. When the input voltage rises, the voltage at terminal 44 is VSS from time t2 to time t3 when the output voltage becomes equal to "(steady-state voltage)−VOSL" to render transistor TP21 conductive and charge the load.

As just described above, a high driving capability transistor is made conductive by combining the push-pull circuit with the tri-state buffer when the difference between the input and output voltages increases to some extent. Thus, the transient response speed is improved. The values of the two supply voltages VOSL and VOSH for setting offset quantities should be as small as possible in order to speed up convergence to the set voltages. However, in order to avoid wrong operation, it is necessary to set the two supply voltages VOSL and VOSH at values sufficiently higher than the input offset voltages of the differential amplifiers (comparators) AMP1 and AMP2. If the circuit is composed of MOS transistors, these values are preferably 50 mV or more. The circuit configuration of the tri-state buffer is not limited to the embodiment illustrated. As long as it realizes a similar function, another system may be employed.

Figure 25A:
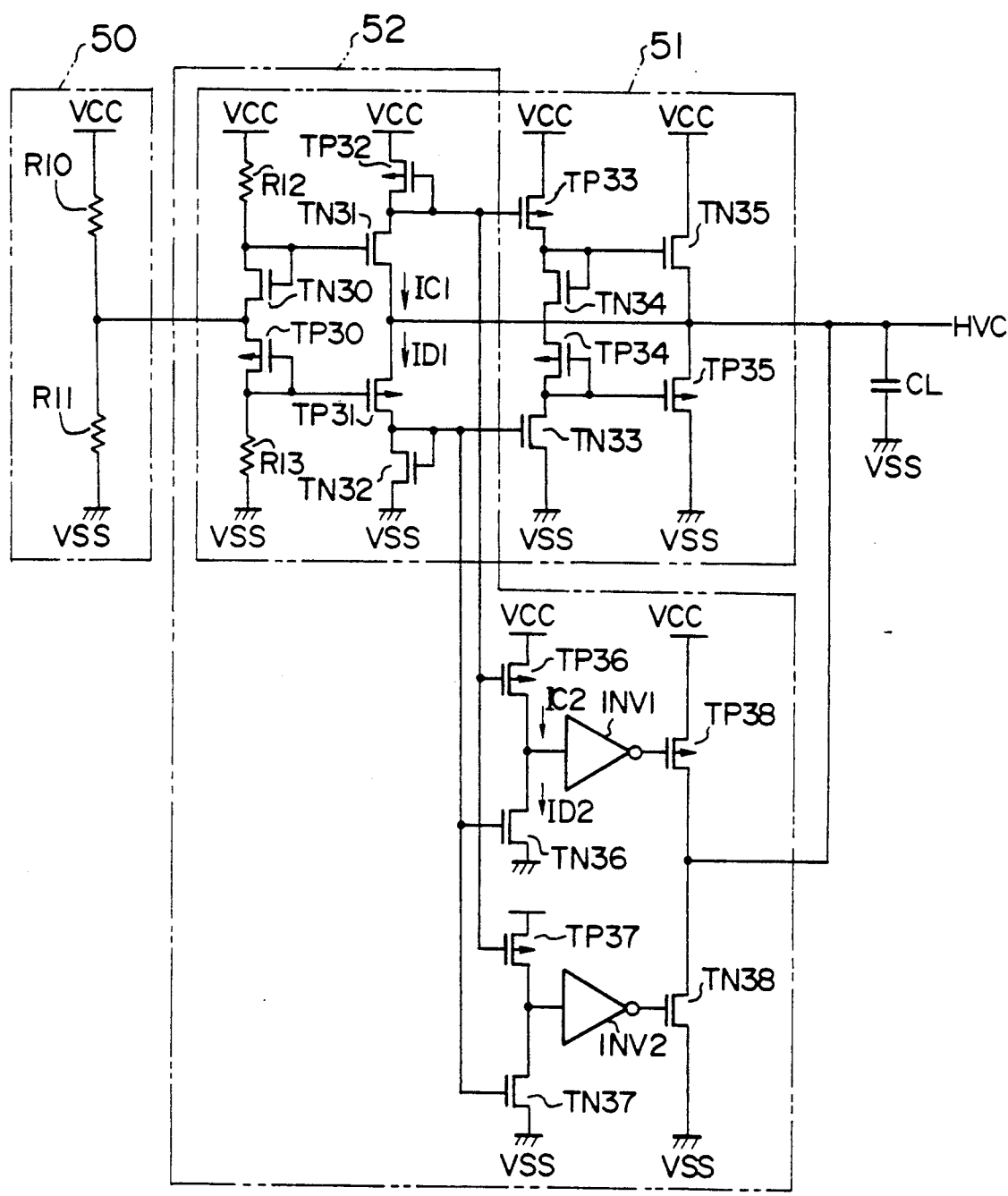
FIG. 25A shows an embodiment of an intermediate voltage generator of a DRAM.

Referring to FIG. 25, an embodiment of an intermediate voltage (VCC/2) generator system of a dynamic memory to which a voltage follower using a tri-state buffer is applied will be described. FIG. 25A illustrates the structure of an intermediate voltage generator according to the present invention. In FIG. 25A, the numeral 50 denotes a reference voltage generator; 51, a voltage follower described with reference to FIG. 21; 52, a tri-state buffer. The circuit includes the combination of the intermediate voltage generator of FIG. 23A and a tri-state buffer. Thus, recoverability is improved which is exhibited when the difference between the input and output voltages increases. The structure and operation of the tri-state buffer will be described below. The present embodiment is characterized in that the first complementary push-pull circuit is used as it is, and that the difference voltage is detected using the difference in mirror ratio of the current mirror circuits to thereby start the tri-state buffer. In FIG. 25A, TP36, TP37 denote P-channel MOS transistor; TN36, TN37, N-channel MOS transistor; INV1, INV2, inverter; TP38, P-channel MOS transistor which drives the load with the output of inverter INV1; and TN38, N-channel MOS transistor which drives the load with the output of inverter INV2. TP32, TP36; TP32, TP37; TN32, TN36; and TN32, TN37 each constitute a current mirror circuit. If (1) the current flowing through transistor TN31 is expressed as IC1, (2) the current flowing through transistor TP31 as ID1, (3) the current flowing through the transistor TN36 as ID2, and (4) the current flowing through transistor TP36 as IC2, the relationship between an error $\delta V$ in the output voltage and IC1, ID1 is approximated, as mentioned above, as $$IC1 - ID1 \approx -2\sqrt{2\beta BI} \times \delta V$$

If the mirror ratios of the current mirror circuits are expressed as $$M_{P1} = \frac{IC2}{IC1} = \frac{\beta_{TP36}}{\beta_{TP32}}$$

$$M_{N1} = \frac{ID2}{ID1} = \frac{\beta_{TN36}}{\beta_{TN32}}$$

then $$\frac{IC2}{M_{P1}} - \frac{ID2}{M_{N1}} \approx -2\sqrt{2\beta I} \times \delta V$$

Assume now that when an offset voltage Vos is applied to the output, IC2=ID2. If the current value at that time is expressed as $I_2$, the offset voltage Vos is given by $$Vos \approx \frac{I_2}{2 \times a} \times \frac{(M_{P1} - M_{N1})}{M_{N1} \times M_{P1}}$$

where $$a = \sqrt{2\beta I_1}$$

and $\beta$ is the $\beta$ of the transistors which constitute the first complementary push-pull circuit and $I_1$ is the current flowing through the first complementary push-pull circuit in its steady state. For example, if $I_1 = 0.2$ µA, $I_2 = 1$ µA, $\beta = 1$ mA/V$^2$, $M_{N1} = 1$ and $M_{P1} = 0.2$, the value of the offset voltage Vos is then −100 mV. Namely, if the output voltage falls from its steady state value by 100 mV or more, the input voltage to inverter INV1 changes from low to high and the output voltage changes from high to low. Therefore, driving P-channel MOS transistor TP38 is made conductive to charge the load. Simultaneously, the constants of transistors TP37 and TN37 are appropriately selected. Thus, when there is a predetermined plus side offset, N-channel MOS transistor TN38 is made conductive to discharge the load.

As mentioned above, by taking a circuit configuration such as that shown by the present embodiment, a function similar to that shown in FIG. 24 is realized. In this circuit system, an offset quantity is determined by the mirror ratios of the current mirror circuits. Therefore, if it is arranged that the difference in characteristic between the transistors of the pair is reduced, the offset quantity is set with high accuracy. Since no additional high quantity differential amplifier is required to be provided, power consumption is small and high performance is realized with a simple structure.

Figure 25B:
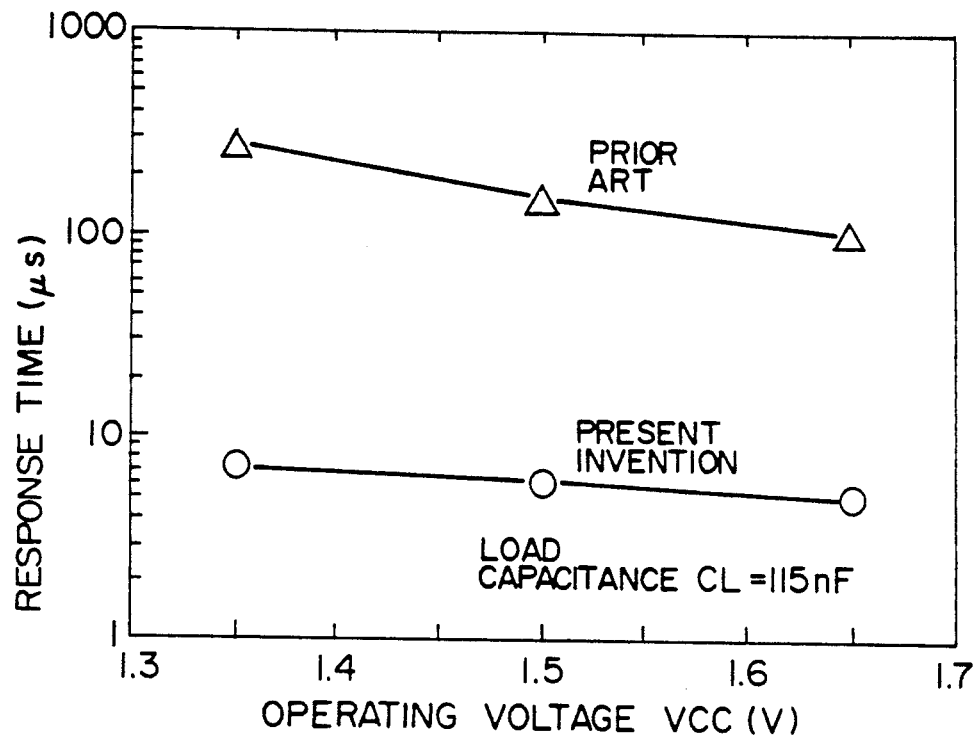
FIG. 25B illustrates the effects of the FIG. 25A embodiment.

FIG. 25B shows the result of comparison in performance between the present circuit system and the conventional circuit system of FIG. 22, obtained by computer analysis. FIG. 25B shows a graph of a rise time of the output voltage after the power source is turned on and plotted versus supply voltage. The rise time is defined as a time required for the output voltage to reach 90% of its steady state of value after the power source is turned on. It is assumed that the value of the load capacitance is the total capacitance of the power source for precharging the bit line for the 64M bit-DRAM and the plate electrode. As will be seen from the result of this analysis, according to the present intermediate voltage generator the rise time is further reduced by about half order of magnitude compared to the embodiment of FIG. 23A. The present intermediate voltage generator starts up the load in a time which is shorter by about one and half orders of magnitude compared to the conventional circuit. As just described above, by combining the push-pull circuit with the tri-state buffer, the voltage follower is provided which follows the input at higher speed. The voltage setting accuracy is determined by the push-pull circuit. Therefore, like the previous embodiment, the difference between the input and output voltages is reduced to a very small value.

In the above embodiment, the circuit structure which drives the large capacitance load of the LSI at high speed was described. However, if the load is desired to be driven at higher speed, a transient current produced in the charge/discharge of the load becomes a big problem. For example, the load capacitance of an intermediate voltage generator, for example, of a DRAM of 64M bit or so is about 115 nF. If the current flowing when this load is driven with amplitudes of 1 volts for 5 μs reaches 23 mA, which matches with the value of a current consumed in the DRAM. If the load is driven at still higher speed, the main circuit characteristics are influenced; for example, noise would be produced on the power source lines and the reliability of the drive signal lines may be degraded undesirably. Generally, in a superhigh LSI, especially in a memory, arrangement used very frequently is such that the entire LSI is composed of a plurality of blocks of the same kind and that some of the blocks are activated in operation. In such LSI, the use of an embodiment to be described below is advantageous.

Figure 26B:
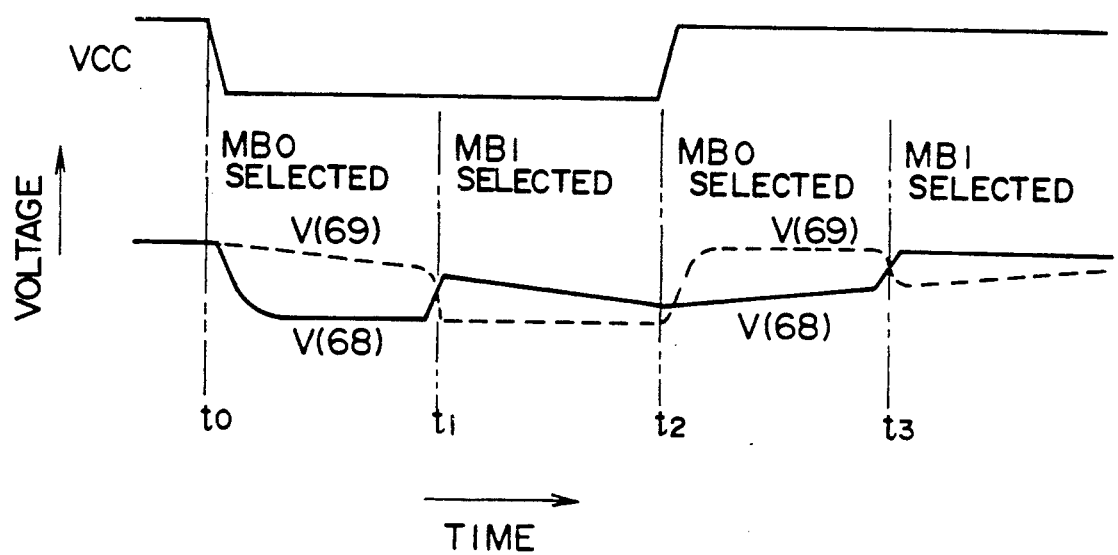
FIG. 26B illustrates changes in the intermediate voltage in the embodiment of FIG. 26A occurring when the supply voltage fluctuates during memory operation.
Figure 26A:
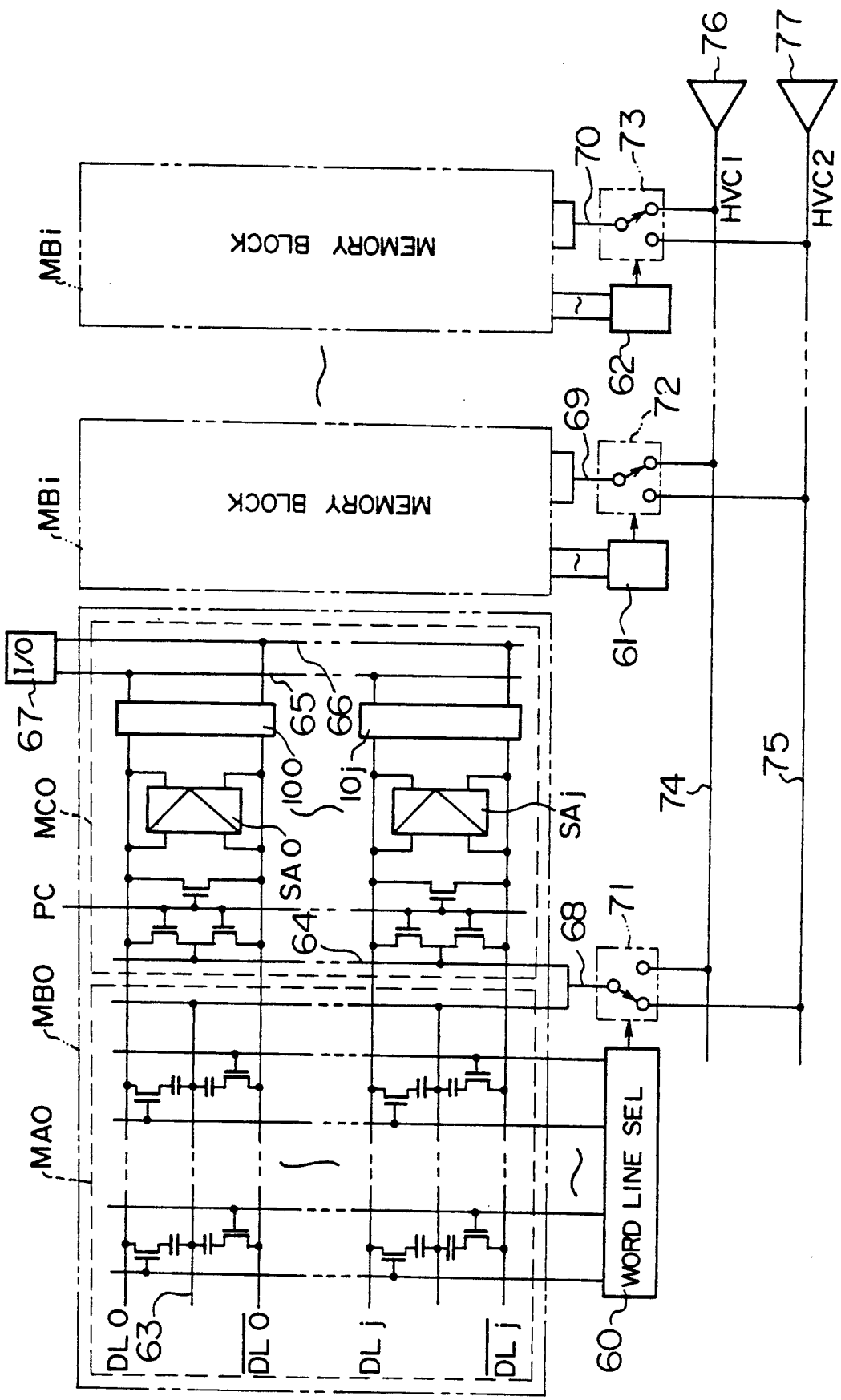
FIG. 26A shows an embodiment of an intermediate voltage means of a DRAM to which a further basic concept of the present invention is applied.

FIG. 26 shows an embodiment of an intermediate voltage supply system of a dynamic memory (DRAM) to which the present invention is applied. In FIG. 26A, MB0, MB1-MBi denote (i+1) memory blocks; 60-62, word line selector; 68-70, intermediate voltage extracting line from each memory block; 76, 77, intermediate voltage generator; 74, 75, signal lines which supply intermediate voltages HVC1, HVC2 from the intermediate voltage generators to the respective memory blocks; 71-73, switch provided in each block so as to supply one of the two signal lines to the memory block. Memory block MB0 includes a memory cell array MA0 which includes a 2-dimensional arrangement of memory cells, an input/output control circuit block MC0 which amplifies a signal read from a memory cell and outputs the amplified signal to an external circuit and writes an external signal to a memory cell, and an input/output circuit 67.

DL0, $\overline{DL0}$, DLj, $\overline{DLj}$ denote a data line for transmitting a signal to a memory cell; 63, plate electrode constituting an opposite electrode of a storage capacitor; 64, precharge voltage supply line disposed so as to put the data line at an intermediate voltage level during non-selection; PC, precharge signal line; SA0-SAj, sense amplifier which senses and amplifies a signal read from a memory cell; 65, 66, pair of common input/output lines for transmitting a signal between the input/output circuit 67 and each data line; IO0-IOj, IO gate which controls connection between the pair of data lines selected by an address designating signal and the common pair of input/output lines.

Assume now that only one MB0 of (i+1) memory blocks is selected and put to its operating state. At this time, one word line in MA0 is selected by the word line selector 60 to change to high level. Simultaneously, switch 71 is controlled such that the intermediate voltage extracting line 68 is connected to signal line 75 for intermediate voltage supply. Extracting lines 60, 70 from memory blocks MB1-MBi in a non-selective state are connected to signal line 74 for supply of an intermediate voltage. By doing so, a load of 1 memory blocks is connected to intermediate voltage generator 76 while only a load of one memory block is connected to intermediate voltage generator 77. If, for example, i=15, the load capacitance driven by intermediate voltage generator 77 is 1/5 of the load capacitance driven by intermediate voltage generator 76. Therefore, even if the same circuit is used for 76 and 77, the intermediate voltage of the selected block MB0 operates at a speed which is 15 times as rapid as the intermediate voltage of the non-selective blocks. From a standpoint of circuit performance, the response speed of the non-selected memory blocks is irrespective of the performance of the memory. Therefore, the entire performance of the memory is improved without substantially increasing its transient current. FIG. 26B shows a change in the intermediate voltage with time when the supply voltage fluctuates during memory operation. More particularly, assume that the voltage VCC falls from time t0 to t2. Further assume that memory block MB0 is selected from time t0 to t1 and after time t3 and that memory block MB1 is selected from time t1 to t3. Since block MB1 is not selected from time t0 to t1, the intermediate voltage V(69) responds slowly. In contrast, since the block MB0 is selected, the intermediate voltage V(68) follows at high speed. When block MB1 is selected and block MB0 is changed to a non-selected state at time t1, V(69) then changes rapidly toward a voltage to be set. As just described above, according to the present embodiment, a large capacitance load such as an intermediate voltage in a dynamic memory can be operated substantially at high speed without increasing a transient current virtually. While the embodiment in which the present invention is applied to an intermediate voltage in the dynamic memory has been described, the present invention is not limited to this embodiment as long as the scope of application is concerned. The present invention is applicable generally to integrated circuits a part of which is activated during operation.

In the above, the details of the present invention have been described in the respective embodiments. However, the scope in which the present invention is applicable is not limited to those embodiments. For example, the cases in which the LSIs are composed of CMOS transistors have mainly been described so far. However, the present invention as it is applicable to, for example, LSIs using bipolar transistors, LSIs using junction FETs, BiCMOS type LSIs including a combination of CMOS transistors and bipolar transistors, and LSIs in which elements are formed on a substrate made, for example, of gallium arsenic, other than silicon.

In the present embodiments, the current mirror circuit was used as the current amplifier. However, other current amplifiers may be used instead.

As described above, the present invention has a circuit configuration in which input/output control circuits which connect data lines and I/O lines are alternately disposed on the right and left sides of a memory cell array and in which the transfer impedance between the data line and I/O line is changed depending on whether the read operation should be performed or the write operation should. Thus the inventive memory operates at high speed even with low supply voltage in a stabilized manner.

The present invention is also suitable for parallel test and greatly reduces the test time.

According to the present invention, since the drive transistor for the word line operates at low gate voltage level, it operates as a word driver in a stabilized manner even if the supply voltage is reduced. The voltage converter boosts up the data line voltage VL at all times to a voltage level VCH which is higher than the data line voltage VL by the threshold voltage VT of the switching transistor of the memory cell. The power source for the word driver sets the gate voltage of its internal rectifying transistor at a level higher than its drain voltage by the threshold voltage. Since a reverse current of electric charges is prevented, the output voltage is raised to 2VL which is the theoretical value of a double voltage generator. Since an oscillator and a timing generator each of which uses a RC delay are used, the oscillating frequency and the delay time between timings are stabilized in spite of fluctuations of the supply voltage. Therefore, the best voltage conversion efficiency is maintained invariably. By selecting three kinds of threshold values of the transistors, the operation is stabilized with a low supply voltage and speeded up and power consumption is reduced. Thus, a semiconductor integrated circuit is realized which operates in a stabilized manner even with the voltage of a single battery as the supply voltage.

According to the present invention, in a superhigh LSI, a circuit configuration is provided which drives large load capacitance at high speed with high voltage accuracy, or a circuit system is provided which drives large load capacitance at high speed without causing a large transient current therethrough. According to the present invention, for example, if the threshold voltage difference of a transistor is 0.2 volts, the reference output voltage of 0.75 volts fluctuates by about 1% while in the conventional circuit the reference output voltage fluctuates about 13% under the same conditions. Namely, according to the present invention, the voltage accuracy is improved by one order of magnitude. Furthermore, high speed responsiveness is obtained in which the rise time of the output voltage after the power source is turned on is improved by about one order of magnitude or more compared to the conventional circuit.

What is claimed is:

1. A semiconductor device comprising:
a first complementary push-pull circuit including a first N-channel MOS transistor and a first P-channel MOS transistor having gates which are supplied with an input signal voltage and source from which a first output signal for driving an output load is generated;
a first current mirror circuit including a second P-channel MOS transistor and a third P-channel MOS transistor having sources which are coupled with a first operating potential, a gate of said second P-channel MOS transistor being coupled with a drain thereof, a drain of said first N-channel MOS transistor and a gate of said third P-channel MOS transistor;
a second current mirror circuit including a second N-channel MOS transistor and a third N-channel MOS transistor having sources which are coupled with a second operating potential, a gate of said second N-channel MOS transistor being coupled with a drain thereof, a drain of said first P-channel MOS transistor and a gate of said third N-channel MOS transistor;
a second complementary push-pull circuit including a fourth N-channel MOS transistor and a fourth P-channel MOS transistor having sources from which a second output signal for driving said output load is generated, a drain of said fourth N-channel MOS transistor being coupled with said first operating potential, a gate of said fourth N-channel MOS transistor being coupled with a drain of said third P-channel MOS transistor of said first current mirror circuit, a drain of said fourth P-channel MOS transistor being coupled with said second operating potential, a gate of said fourth P-channel MOS transistor being coupled with a drain of said third N-channel MOS transistor of said second current mirror circuit; and
a tri-state buffer coupled between said first operating potential and said second operating potential and having a first input terminal coupled with said drain of said first N-channel MOS transistor, a second input terminal coupled with said drain of said first P-channel MOS transistor and an output terminal from which a third output signal for driving said output load is generated.
wherein said sources of said first N- and P-channel MOS transistors of said first complementary push-pull circuit are coupled with said sources of said fourth N- and P-channel MOS transistors of said second complementary push-pull circuit and said output terminal of said tri-state buffer so that said first complementary push-pull circuit, said second complementary push-pull circuit and tri-state buffer cooperatively generate a steady state value of an output voltage at said output load in response to said input signal voltage,
wherein said tri-state buffer pulls up said third output signal towards said first operating potential when said output voltage at said output load is lower than said steady state value by a first predetermined value, said tri-state buffer pulls down said third output signal towards said second operating potential when said output voltage at said output load is higher than said steady state value by a second predetermined value, and said tri-state buffer neither pulls up nor pulls down said third output signal when said output voltage at said output load is higher than said steady state by said first predetermined value and lower than steady state by said second predetermined value.

2. A semiconductor device according to claim 1, wherein said first complementary push-pull circuit further includes a fifth N-channel MOS transistor a gate and a drain of which are coupled with each other, and a fifth P-channel MOS transistor a gate and a drain of which are coupled with each other, said input signal voltage supplied to said gate of said first N-channel MOS transistor via a source-drain path of said fifth N-channel MOS transistor, and said input signal voltage supplied to said gate of said first P-channel MOS transistor via a source-drain path of said fifth P-channel MOS transistor.

3. A semiconductor device according to claim 2 further comprising:

a reference voltage generator, coupled between said first operating potential and said second operating potential, for generating an intermediate reference voltage between said first operating potential and said second operating potential, said intermediate reference voltage supplied to said gates of said first N- and P-channel MOS transistors of said first complementary push-pull circuit as said input signal voltage.

4. A semiconductor device according to claim 2, wherein said tri-state buffer includes:

a sixth P-channel MOS transistor having a source coupled with said first operating potential and a gate coupled with said first input terminal;

a sixth N-channel MOS transistor having a source coupled with said second operating potential and a gate coupled with said second input terminal;

a seventh P-channel MOS transistor having a source coupled with said first operating potential and a gate coupled with said first input terminal;

a seventh N-channel MOS transistor having a source coupled with said first operating potential and a gate coupled with said second input terminal;

a first inverter an input of which is coupled with drains of said sixth P- and N-channel MOS transistors;

a second inverter an input of which is coupled with drains of said seventh P- and N-channel MOS transistors;

an eighth P-channel MOS transistor having a source coupled with said first operating potential, a gate coupled with said output terminal of said tri-state buffer; and an eighth N-channel MOS transistor having a source coupled with said second operating potential, a gate coupled with an output of said second inverter and a drain coupled with said output terminal of said tri-state buffer.

* * * * *

UNITED STATES PATENT AND TRADEMARK OFFICE
CERTIFICATE OF CORRECTION

PATENT NO.   :   5,264,743
DATED        :   November 23, 1993
INVENTOR(S)  :   Yoshinobu Nakagome, et al.

It is certified that error appears in the above-identified patent and that said Letters Patent is hereby corrected as shown below:

Claim 4, column 32, line 11, delete "first" and substitute therefor --second--.

Signed and Sealed this

Tenth Day of May, 1994

Attest:

BRUCE LEHMAN

Attesting Officer    Commissioner of Patents and Trademarks